(12) United States Patent
Jin et al.

(10) Patent No.: US 11,322,353 B2
(45) Date of Patent: May 3, 2022

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Jisong Jin, Shanghai (CN); Zejun He, Shanghai (CN); Jia Ni, Shanghai (CN); Yanhua Wu, Shanghai (CN); Junling Pang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 173 days.

(21) Appl. No.: 16/800,132

(22) Filed: Feb. 25, 2020

(65) Prior Publication Data
US 2020/0279737 A1  Sep. 3, 2020

(30) Foreign Application Priority Data
Mar. 1, 2019  (CN) .......................... 201910155842.7

(51) Int. Cl.
*H01L 21/033* (2006.01)
*H01L 21/311* (2006.01)
(Continued)

(52) U.S. Cl.
CPC ...... *H01L 21/0337* (2013.01); *H01L 21/0274* (2013.01); *H01L 21/0332* (2013.01); *H01L 21/31051* (2013.01); *H01L 21/31144* (2013.01); *H01L 21/76816* (2013.01); *H01L 21/76877* (2013.01)

(58) Field of Classification Search
CPC ............ H01L 21/0337; H01L 21/0332; H01L 21/0334; H01L 21/0338; H01L 21/31144; H01L 21/76816; H01L 21/0274
See application file for complete search history.

(56) References Cited

U.S. PATENT DOCUMENTS 8,987,142 B2 *  3/2015  Lee ..................... H01L 21/0332
                                                438/703
9,153,478 B2 * 10/2015  Liu ................... H01L 21/31055
(Continued)

*Primary Examiner* — Bac H Au
(74) *Attorney, Agent, or Firm* — Anova Law Group, PLLC

(57) ABSTRACT

A semiconductor device and a method for forming the semiconductor device are provided. The method includes providing a layer to-be-etched including a first sub-trench region and a second sub-trench region. The method also includes forming a first mask layer over the layer to-be-etched and a second mask layer over the first mask layer, and forming a first sub-trench disposed over the first sub-trench region in the second mask layer. In addition, the method includes forming a first divided trench in the first mask layer and forming a second sub-trench disposed over the second sub-trench region in the second mask layer. Further, the method includes forming a first divided filling layer in the first divided trench, and forming a first middle trench in the first mask layer. The first divided filling layer divides the first middle trench in a second direction.

18 Claims, 19 Drawing Sheets

(51) Int. Cl.
*H01L 21/027* (2006.01)
*H01L 21/768* (2006.01)
*H01L 21/3105* (2006.01)

(56) References Cited

U.S. PATENT DOCUMENTS

| | | | |
|---|---|---|---|
| 9,368,349 B2* | 6/2016 | Huang | H01L 21/0338 |
| 9,911,604 B1* | 3/2018 | Sun | H01L 21/32139 |
| 9,934,970 B1* | 4/2018 | Burns | H01L 21/31144 |
| 10,504,774 B2* | 12/2019 | Singh | H01L 21/76802 |
| 10,566,207 B2* | 2/2020 | Kim | H01L 21/823431 |
| 10,790,155 B2* | 9/2020 | Liu | H01J 37/32623 |
| 11,183,384 B2* | 11/2021 | Jin | H01L 21/3215 |
| 2016/0079063 A1* | 3/2016 | Lee | H01L 21/76879 |
| | | | 438/675 |
| 2017/0092506 A1* | 3/2017 | deVilliers | H01L 21/0337 |
| 2017/0125248 A1* | 5/2017 | Siew | H01L 21/0335 |
| 2019/0157094 A1* | 5/2019 | Lin | H01L 21/0332 |
| 2020/0135542 A1* | 4/2020 | Felix | H01L 21/31051 |
| 2020/0168458 A1* | 5/2020 | Liao | H01L 21/0332 |

* cited by examiner

SEMICONDUCTOR DEVICE AND FABRICATION METHOD THEREOF

CROSS-REFERENCES TO RELATED APPLICATIONS

This application claims the priority of Chinese patent application No. 201910155842.7, filed on Mar. 1, 2019, the entirety of which is incorporated herein by reference.

FIELD OF THE DISCLOSURE

The present disclosure generally relates to the field of semiconductor manufacturing and, more particularly, relates to a semiconductor device and a fabrication method thereof.

BACKGROUND

In a semiconductor device manufacturing process, a pattern of a mask is often transferred to a substrate using a photolithography process. The photolithography process includes providing a substrate and forming a photoresist layer on the substrate. The photolithography process also includes exposing and developing the photoresist layer to form a patterned photoresist layer, such that the pattern of the mask is transferred to the photoresist layer. Further, the photolithography process includes etching the substrate by using the patterned photoresist layer as a mask to transfer the pattern on the photoresist layer to the substrate, followed by removing the photoresist layer.

As the size of the semiconductor device continues to shrink, the critical dimension in photolithography gradually approaches or even exceeds the physical limits of photolithography, which poses substantially serious challenges for photolithography. A basic idea of double patterning technique is to form an ultimate target pattern by patterning twice to overcome the photolithography limit that cannot be achieved by patterning once.

However, the difficulty of a conventional process for forming the semiconductor device is substantially high. The disclosed methods and device structures are directed to solve one or more problems set forth above and other problems.

BRIEF SUMMARY OF THE DISCLOSURE

One aspect of the present disclosure includes a method for forming a semiconductor device. The method includes providing a layer to-be-etched. The layer to-be-etched includes a plurality of first regions arranged along a first direction, and a first region includes a first trench region. The first trench region includes a first sub-trench region and a second sub-trench region, and the first sub-trench region is in contact with an adjacent second sub-trench region in a second direction. The second direction is perpendicular to the first direction. The method also includes forming a first mask layer over the layer to-be-etched and a second mask layer over the first mask layer, and forming a first sub-trench disposed over the first sub-trench region in the second mask layer over the first region. Moreover, the method includes forming a first photolithography mask layer over the second mask layer and a first portion of the first sub-trench. The first photolithography mask layer has a first photolithography opening disposed over a second portion of the first sub-trench, and the first photolithography opening is extended to the second mask layer over the second sub-trench region in the second direction. In addition, the method includes by using the first photolithography mask layer and the second mask layer as a mask, etching the first mask layer to form a first divided trench in the first mask layer over the first region. The first divided trench is disposed at a bottom of an edge of the first sub-trench in the second direction. After forming the first divided trench, the method includes removing the first photolithography mask layer. After removing the first photolithography mask layer, the method includes removing the second mask layer over the second sub-trench region to form a second sub-trench disposed over the second sub-trench region in the second mask layer over the first region. The second sub-trench is connected to the first sub-trench to form a first trench. After forming the first trench, the method includes forming a first divided filling layer in the first divided trench. Further, the method includes by using the first divided filling layer as a mask, etching the first mask layer at a bottom of the first trench to form a first middle trench in the first mask layer over the first region. The first divided filling layer divides the first middle trench in the second direction.

Another aspect of the present disclosure includes a semiconductor device. The semiconductor device includes a substrate including a plurality of first regions arranged along a first direction, and a first mask layer formed over the substrate. The semiconductor device also includes a second mask layer formed over the first mask layer, and a first middle trench formed in the first mask layer over a first region. In addition, the semiconductor device includes a first divided filling layer formed over the substrate. The first divided filling layer divides the first middle trench in a second direction, and the second direction is perpendicular to the first direction. Further, the semiconductor device includes a first trench formed in the second mask layer over the first region.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
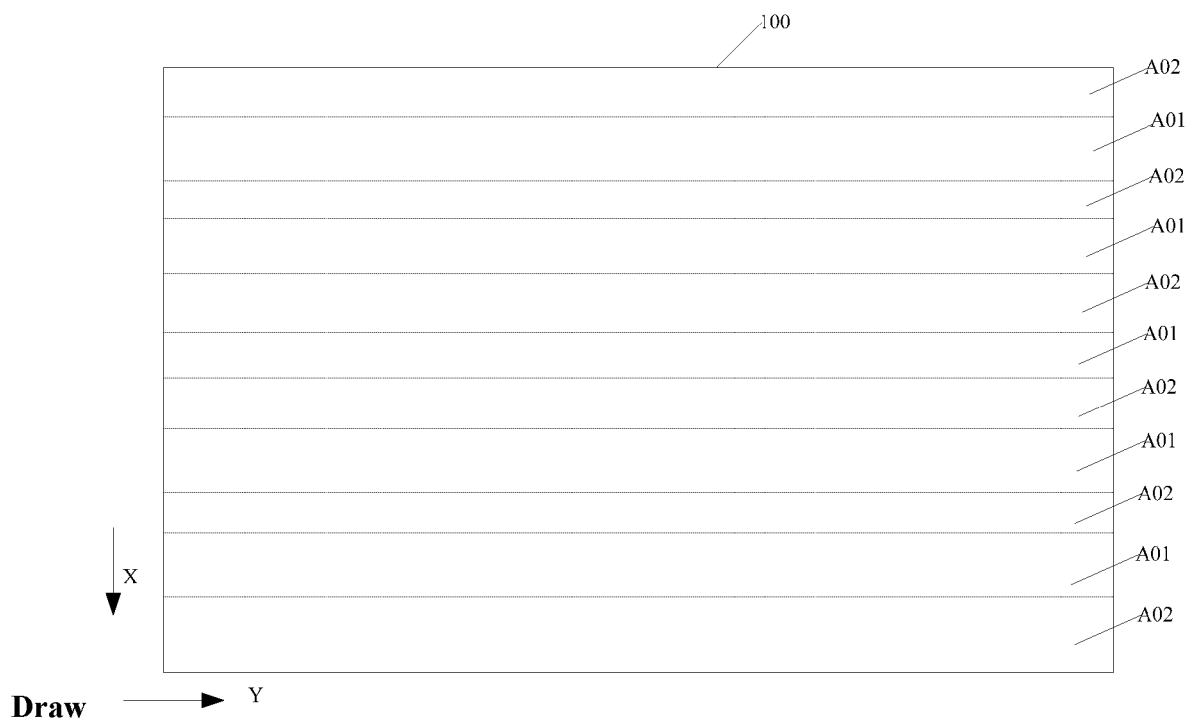
FIGS. 1-5 illustrate semiconductor structures corresponding to certain stages for forming a semiconductor device.

FIGS. 1-5 illustrate semiconductor structures corresponding to certain stages for forming a semiconductor device. Referring to FIG. 1, a layer 100 to-be-etched is provided. The layer 100 to-be-etched includes a plurality of first regions A01 and a plurality of second regions A02. The first regions A01 and the second regions A02 are alternately arranged along a first direction X. The first region A01 is in contact with an adjacent second region A02.

Figure 2:
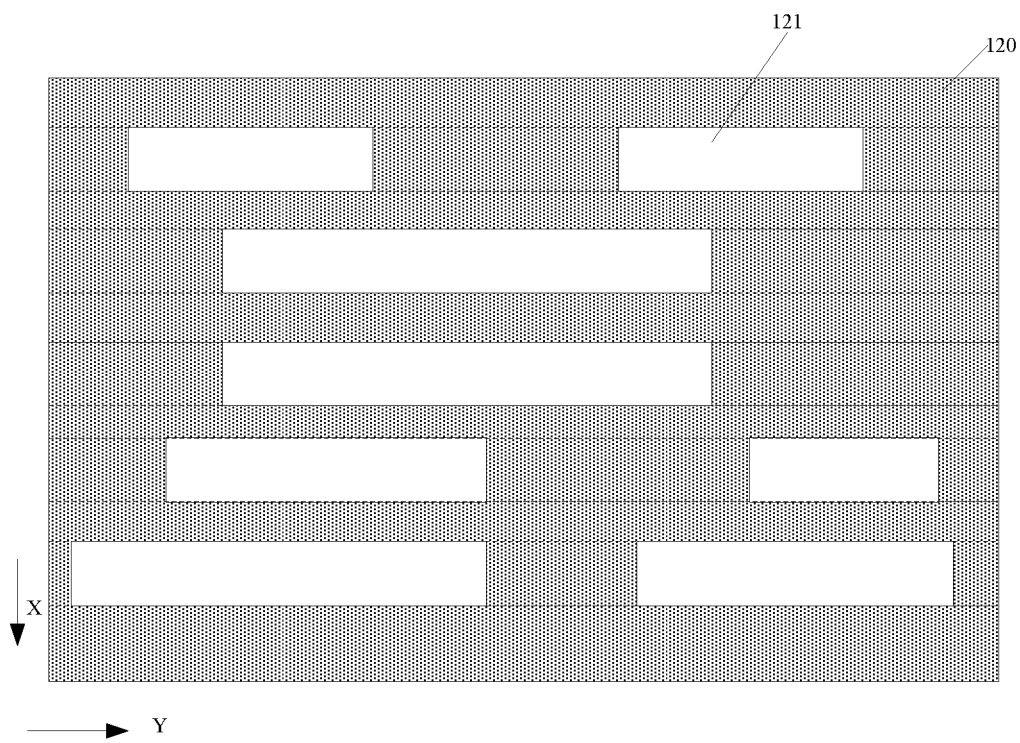

Referring to FIG. 2, a first mask layer 120 is formed over the first regions A01 and the second regions A02 of the layer 100 to-be-etched. A first trench 121 is formed in the first mask layer 120 over the first region A01.

Figure 3:
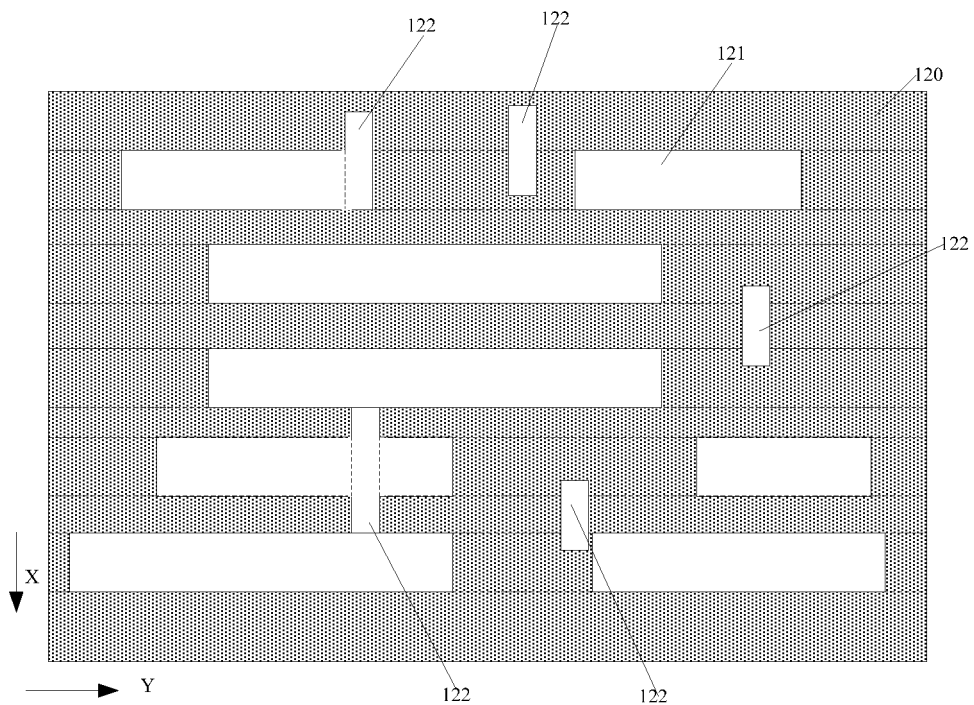

Referring to FIG. 3, a divided trench 122 is formed in the first mask layer 120 in a portion of the second region A02. An extension direction of the divided trench 122 is parallel to the first direction X, and the divided trench 122 can also be extended to the first region A01. One or more divided trenches 122 are connected to the first trench 121, one or more divided trenches 122 are separated from the first trench 121.

Figure 4:
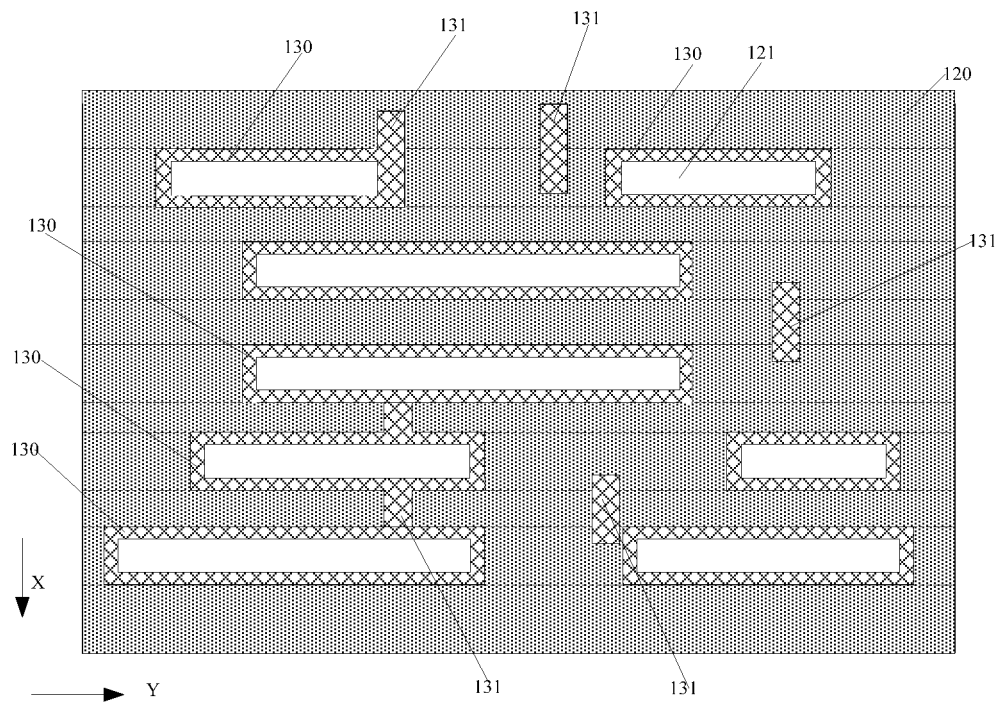

Referring to FIG. 4, a mask sidewall spacer 130 is formed on a sidewall of the first trench 121. A divided mask layer 131 is formed in the divided trench 122 when forming the mask sidewall spacer 130. The divided trench 122 over the second region A02 is fully filled with the divided mask layer 131. A width of the divided mask layer 131 in the second direction Y is less than or equal to twice a thickness of the mask sidewall spacer 130.

Figure 5:
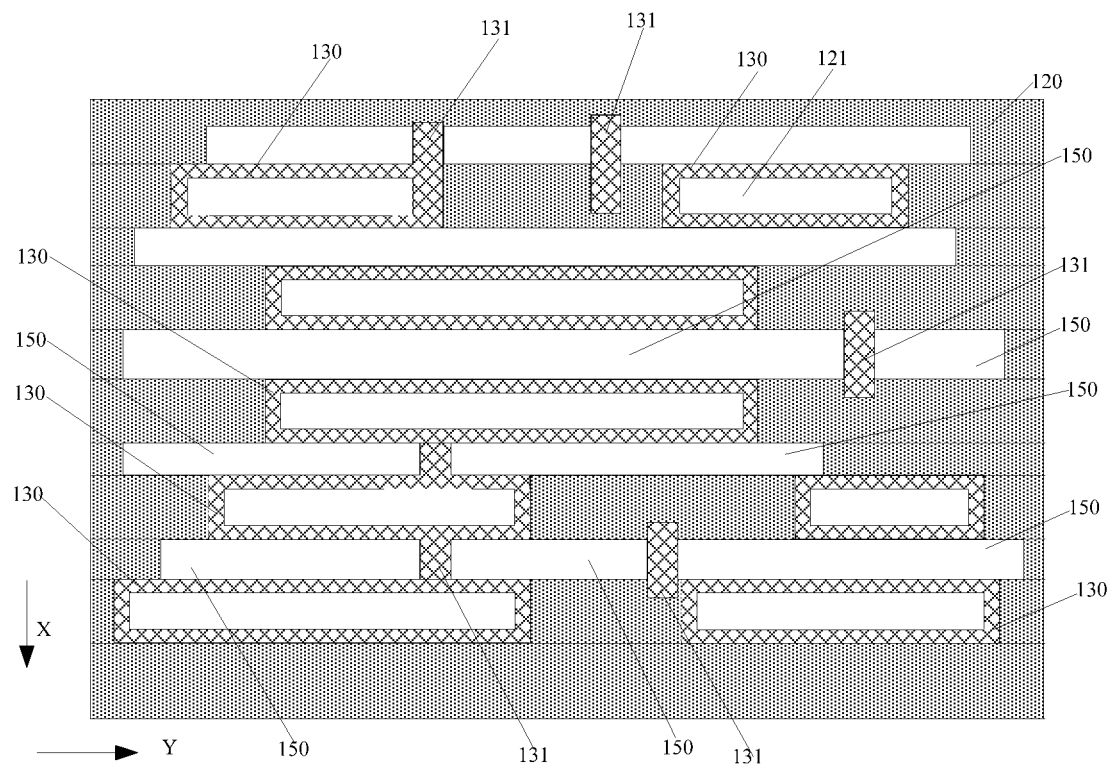

Referring to FIG. 5, after forming the mask sidewall spacer 130 and the divided mask layer 131, a second trench 150 is formed in the first mask layer 120 over the second region A02. A sidewall of the second trench 150 exposes the mask sidewall spacer 130, and the second trench 150 is cut in the second direction by the divided trench 122 over the second region A02. The second direction is perpendicular to the first direction X.

The divided trench 122 can be extended to the first region A01. Alternatively, the divided trench 122 and the first trench 121 are connected to each other. Because the width of the first trench 121 in the first direction is greater than the width of the divided trench 122 in the second direction, even if one or more divided trenches 122 are connected with the first trench 121, when forming the mask sidewall spacer 130, the region where the divided trench 122 is connected to the first trench 121 is not fully filled with the mask sidewall spacer 130, and the first trench 121 is not cut by the divided mask layer 131 in the second direction.

For the divided trench 122 separated from the first trench 121, the divided trench 122 can also be extended to the first region A01, such that the divided mask layer 131 can also be extended to the first region A01. In view of this, the first trench 121 is not cut by the divided mask layer 131 in the second direction. After forming the divided mask layer 131, the divided mask layer 131 can fully divide the first mask layer 120 over the second region and cannot divide the first trench 121. When forming the second trench 150, the second trench 150 is fully cut by the divided mask layer 131 in the second direction due to the blocking of the divided mask layer 131.

The first trench 121 often desires to be cut, and a region where the first trench 121 desires to be cut and a region where the divided mask layer 131 is disposed desire to be shifted in the second direction. Therefore, before forming the first trench 121, a divided structure is formed in the first mask layer 120 over the first region. The divided structure is adapted to divide the first trench 121 to form a first sub-trench.

However, to enable the region where the first trench 121 desires to be cut and the region where the divided mask layer 131 is disposed to be shifted in the second direction, the divided structure cannot be extended to the first mask layer 120 at a position corresponding to the second trench. Therefore, the divided structure desires to have a substantially small size in the first direction. To enable the spacing between first sub-trenches on both sides of the divided structure in the second direction to be substantially small, the divided structure desires to have a substantially small size in the second direction. Accordingly, the divided structure not only has a substantially small size in the first direction, but also has a substantially small size in the second direction. A position of the divided structure is directly defined by a photolithography opening in a photolithography layer. Therefore, the photolithography opening has a substantially small size in both the first direction and the second direction, which poses substantially large challenges on the photolithography process and increases the process difficulty.

The present disclosure provides a method for forming a semiconductor device. The method may include forming a first sub-trench in a first sub-trench region in a second mask layer in a first region, and forming a first photolithography mask layer over the second mask layer and a first portion of the first sub-trench. The first photolithography mask layer may have a first photolithography opening disposed over a second portion of the first sub-trench, and the first photolithography opening may be extended to the second mask layer in a second sub-trench region in the second direction. The method may also include by using the first photolithography mask layer and the second mask layer as a mask, etching the first mask layer to form a first divided trench in the first mask layer over the first region. The first divided trench may be disposed at a bottom of an edge of the first sub-trench in the second direction.

In addition, the method may include removing the first photolithography mask layer after forming the first divided trench, and after removing the first photolithography mask layer, removing the second mask layer over the second sub-trench region by etching to form a second sub-trench disposed over the second sub-trench region in the second mask layer over the first region. The second sub-trench may be connected to the first sub-trench to form a first trench. Moreover, the method may include after forming the first trench, forming a first divided filling layer in the first divided trench. Further, the method may include by using the first divided filling layer as a mask, etching the first mask layer at the bottom of the first trench to form a first middle trench in the first mask layer over the first region. The first divided filling layer may divide the first middle trench in the second direction. The above-disclosed method may reduce the process difficulty.

Figure 48:
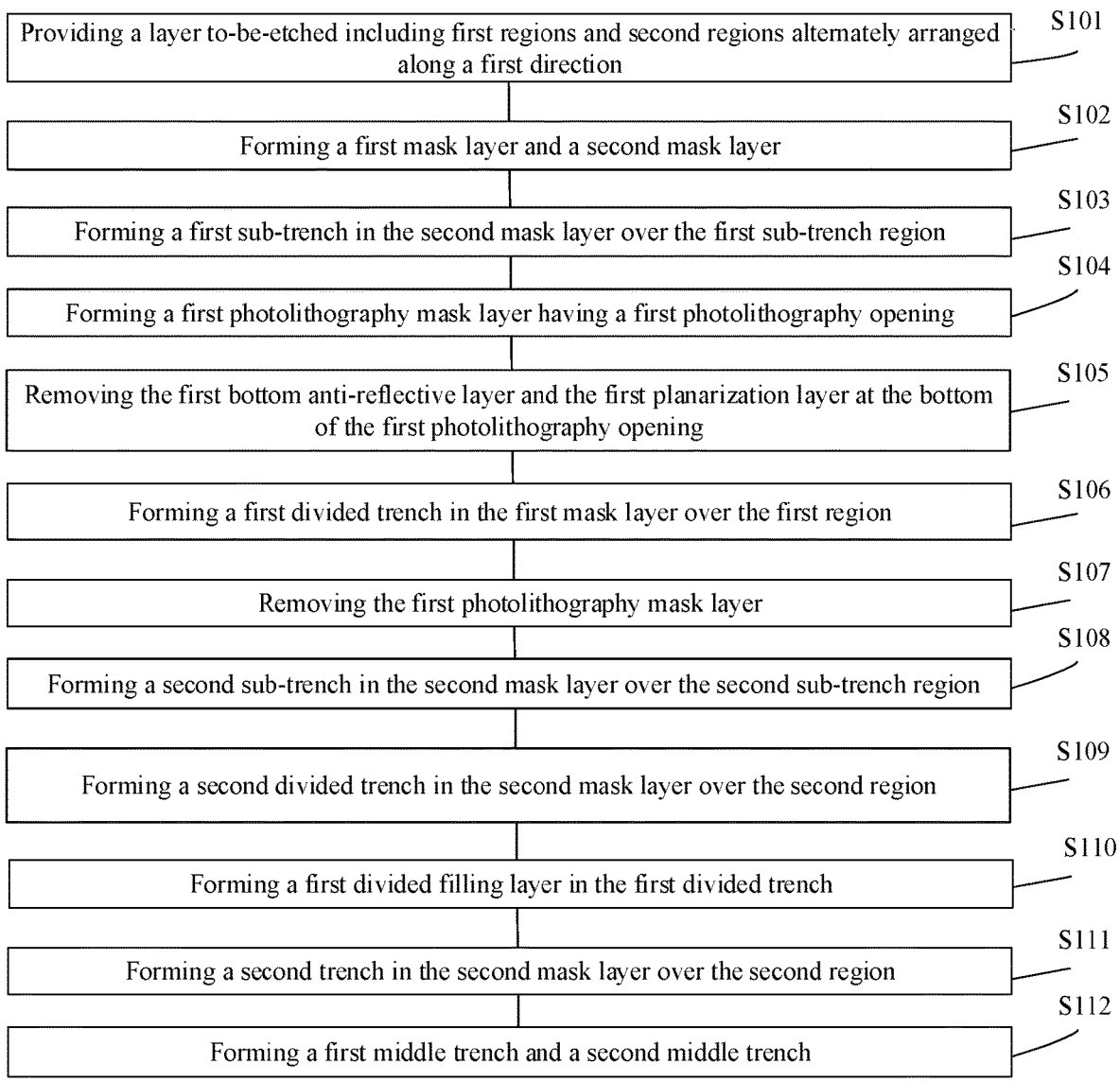
FIG. 48 illustrates an exemplary method for forming a semiconductor device consistent with various disclosed embodiments of the present disclosure.

FIG. 48 illustrates an exemplary method for forming a semiconductor device consistent with various disclosed embodiments of the present disclosure; and FIGS. 6-30 illustrate semiconductor structures corresponding to certain stages of the exemplary fabrication method.

Figure 6:
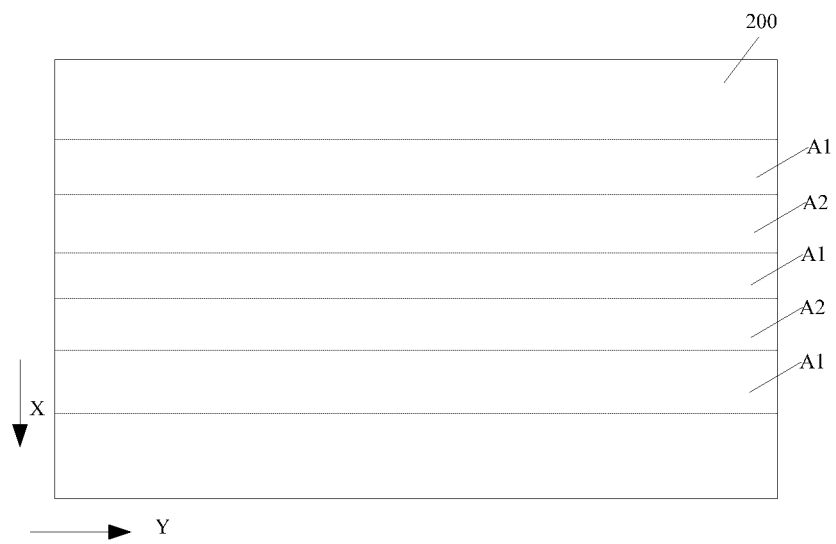
FIGS. 6-30 illustrate semiconductor structures corresponding to certain stages for forming an exemplary semiconductor device consistent with various disclosed embodiments of the present disclosure.

As shown in FIG. 48, at the beginning of the fabrication method, a layer to-be-etched may be provided (S101). FIG. 6 illustrates a corresponding semiconductor structure.

Referring to FIG. 6, a layer 200 to-be-etched may be provided. The layer 200 to-be-etched may be made of a material including silicon oxide or a low-K dielectric layer (dielectric constant K is 3.9 or less). The layer 200 to-be-etched may include a plurality of first regions A1 and a plurality of second regions A2. The first regions A1 and the second regions A2 may be alternately arranged along a first direction X, and the first region A1 may be in contact with an adjacent second region A2.

The plurality of first regions A1 may be arranged along the first direction X, and the plurality of second regions A2 may be arranged along the first direction X. The alternate arrangement of the first regions A1 and the second regions A2 in the first direction X may refer to that merely one second region is disposed between adjacent first regions, and merely one first region is disposed between adjacent second regions. In certain embodiments, a quantity of the first regions may be equal to a quantity of the second regions.

The first region A1 may include a first trench region. The first region may include a first sub-trench region and a second sub-trench region, and the first sub-trench region may be in contact with the second sub-trench region in the second direction Y. The second direction may be perpendicular to the first direction. The first trench region may be used to define a position of a subsequently formed first trench. The first sub-trench region may be used to define a position of a subsequently formed first sub-trench, and the second sub-trench region may be used to define a position of a subsequently formed second sub-trench.

Figure 7:
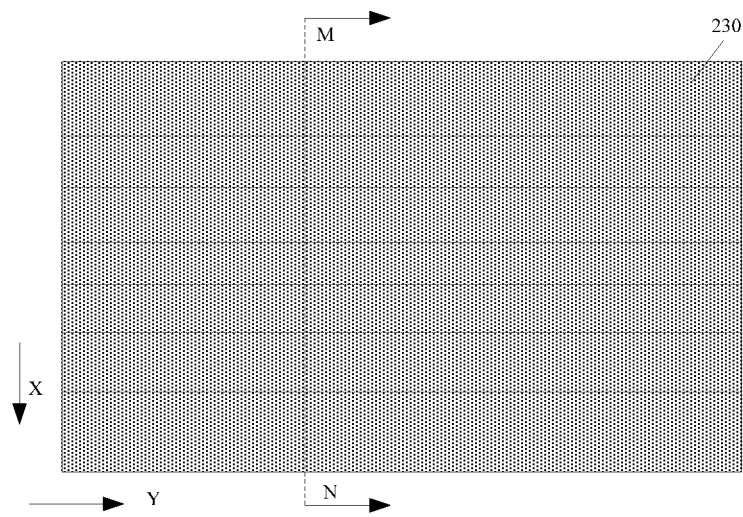
Figure 8:
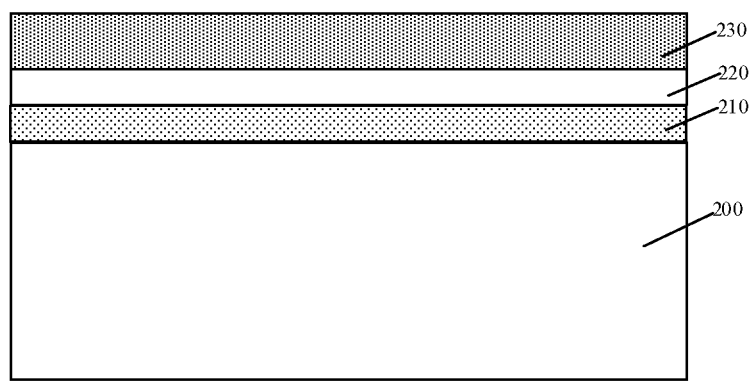

Returning to FIG. 48, after providing the layer to-be-etched, a first mask layer and a second mask layer may be formed (S102). FIGS. 7-8 illustrate a corresponding semiconductor structure. FIG. 7 illustrates a schematic diagram formed on the basis of FIG. 6, and FIG. 8 illustrates a cross-sectional view along a line 'M-N' in FIG. 7.

Referring to FIGS. 7-8, a first mask layer 220 may be formed over the first regions A1 and the second regions A2 of the layer 200 to-be-etched, and a second mask layer 230 may be formed on the first mask layer 220. In one embodiment, the first mask layer 220 may be made of a material different from the second mask layer 230. In one embodiment, the first mask layer 220 may be made of a material including Sift, SiN, or amorphous silicon, and the second mask layer 230 may be made of a material including Sift, SiN, or amorphous silicon. In one embodiment, the first mask layer 220 may be made of a material including $SiO_2$, and the second mask layer 230 may be made of a material including amorphous silicon.

In one embodiment, before forming the first mask layer 220, an adhesive layer (not illustrated) may be formed on the layer 200 to-be-etched, and a bottom hard mask layer 210 may be formed on the adhesive layer. The first mask layer 220 may be formed on the bottom hard mask layer 210, and the second mask layer 230 may be formed on the first mask layer 220.

The bottom hard mask layer 210 may be made of a material including titanium nitride. The adhesive layer may be made of a material including silicon oxycarbide (SiOC). The adhesive layer may be used to improve the adhesion between the bottom hard mask layer 210 and the layer 200 to-be-etched, such that the bond between the bottom hard mask layer 210 and the layer 200 to-be-etched may be substantially strong. The first mask layer 220 may be used to improve the adhesion between the second mask layer 230 and the bottom hard mask layer 210, such that the bond between the second mask layer 230 and the bottom hard mask layer 210 may be substantially strong.

The bottom hard mask layer 210 may be used as an etching stop layer. The bottom hard mask layer 210 may be used as a stop layer for subsequently planarizing a conductive film. The bottom hard mask layer 210 may be made of a hard mask material. When subsequently forming a first target trench and a second target trench by etching, the etching loss of the bottom hard mask layer 210 may be substantially small. Therefore, when transferring the pattern of the bottom hard mask layer 210 to the layer 200 to-be-etched, the stability of pattern transfer may be substantially high. In certain embodiments, the bottom hard mask layer and the adhesive layer may not be formed.

Figure 9:
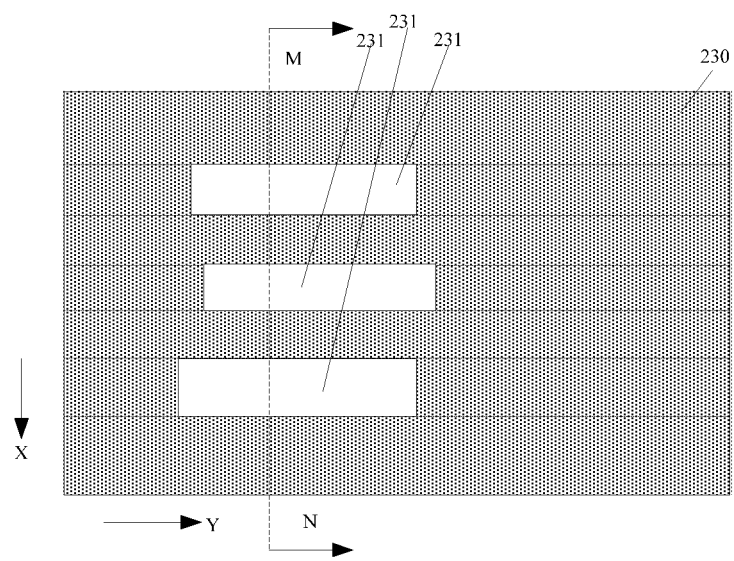
Figure 10:
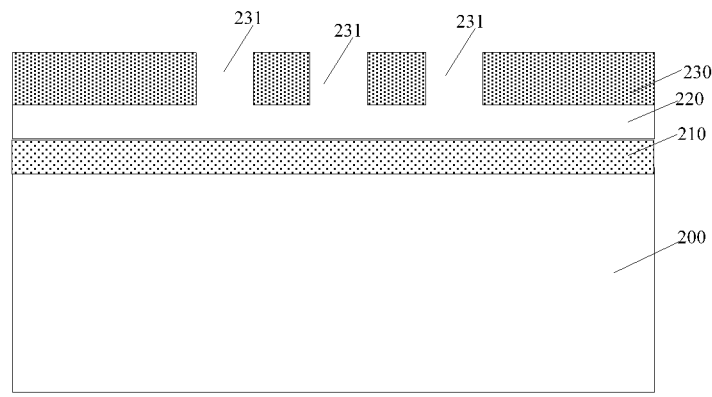

Returning to FIG. 48, after forming the first mask layer and the second mask layer, a first sub-trench may be formed (S103). FIGS. 9-10 illustrate a corresponding semiconductor structure. FIG. 9 illustrates a schematic diagram formed on the basis of FIG. 7, and FIG. 10 illustrates a schematic diagram formed on the basis of FIG. 8. FIG. 10 illustrates a cross-sectional view along a line 'M-N' in FIG. 9.

Referring to FIGS. 9-10, a first sub-trench 231 disposed over the first sub-trench region may be formed in the second mask layer 230 over the first region A1. The first sub-trench 231 may be extended in the second direction Y, and the second direction Y may be perpendicular to the first direction X. A width of the first sub-trench 231 in the first direction X may be in a range of approximately 10 nm-60 nm. In the first direction X, a spacing between adjacent first sub-trenches 231 may be in a range of approximately 10 nm-60 nm. Forming the first sub-trench 231 may include a dry etching process, e.g., an anisotropic dry etching process.

Figure 11:
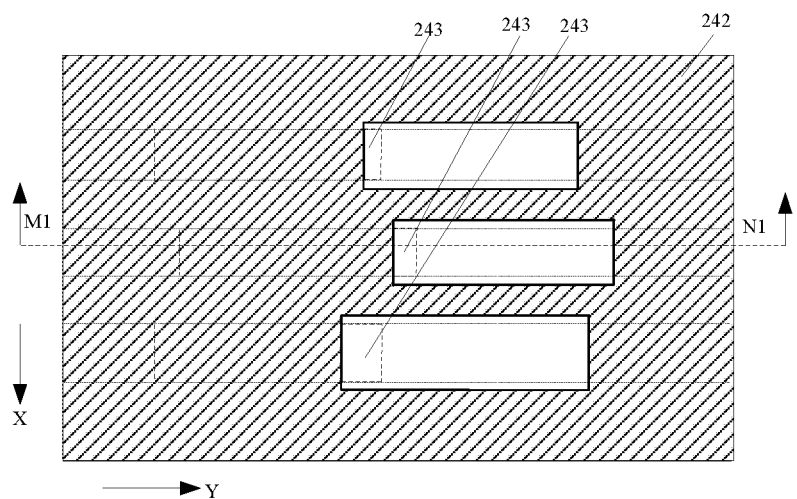
Figure 12:
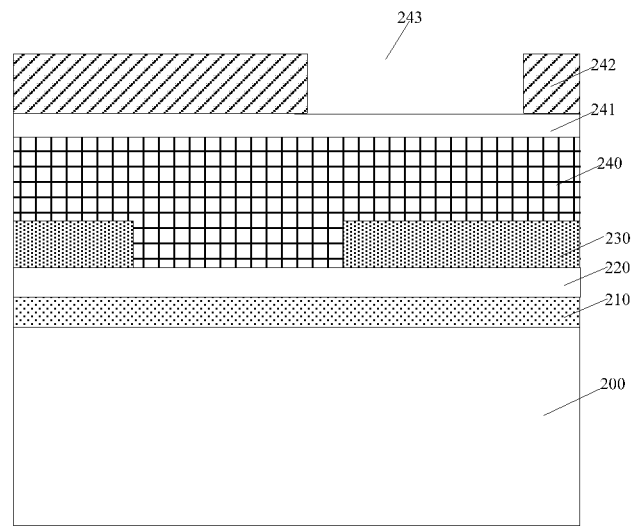

Returning to FIG. 48, after forming the first sub-trench, a first photolithography opening may be formed (S104). FIGS. 11-12 illustrate a corresponding semiconductor structure. FIG. 11 illustrates a schematic diagram formed on the basis of FIG. 9, and FIG. 12 illustrates a cross-sectional view along a line 'M1-N1' in FIG. 11.

Referring to FIGS. 11-12, a first planarization layer 240 may be formed on the second mask layer 230, and in and over the first sub-trench 231. A first bottom anti-reflective layer 241 may be formed on the first planarization layer 240. A patterned first photolithography mask layer 242 may be formed on the first bottom anti-reflective layer 241, and the first photolithography mask layer 242 may be disposed over the second mask layer 230 and a first portion of the first sub-trench 231. The first photolithography mask layer 242 may have a first photolithography opening 243 disposed over a second portion of the first sub-trench region. The first photolithography opening 243 may be extended to the second mask layer 230 over the second sub-trench region in the second direction.

An extension direction of the first photolithography opening 243 may be parallel to the second direction Y. An overlapped region between the first photolithography opening 243 and the first sub-trench 231 may be used to define a position of a subsequently formed first divided filling layer.

In one embodiment, a width of the first photolithography opening 243 in the first direction X may be greater than a width of the first sub-trench 231 in the first direction X. Thus, the size of the subsequently formed first divided filling layer in the first direction X may be limited by the width of the first sub-trench 231 in the first direction X. When the width of the first photolithography opening 243 in the first direction X is greater than the width of the first sub-trench 231 in the first direction X, the width of the first photolithography opening 243 in the first direction X may be close to the width of the first sub-trench 231 in the first direction X. In one embodiment, for illustrative purposes, the width of the first photolithography opening 243 in the first direction X is greater than the width of the first sub-trench 231 in the first direction X as an example.

In another embodiment, the width of the first photolithography opening 243 in the first direction X may be equal to the width of the first sub-trench 231 in the first direction X. Thus, the size of the subsequently formed first divided filling layer in the first direction X may be limited by the width of the first sub-trench 231 in the first direction X. In view of this, the first photolithography opening 243 extended to the second mask layer 230 over the second sub-trench region may be used to define a position of a second sub-trench subsequently formed by etching the second mask layer over the second sub-trench region, which may reduce a quantity of illuminations, simplify the process, and reduce the cost. After the patterns of the second sub-trench and the first sub-trench are subsequently transferred to a first middle trench, the first middle trench at the bottom of the first sub-trench may have a size in the first direction equal to the first middle trench at the bottom of the second sub-trench. The first divided filling layer may be capable of separating the first middle trench at the bottom of the first sub-trench and the first middle trench at the bottom of the second sub-trench.

In certain embodiments, the width of the first photolithography opening 243 in the first direction X may be smaller than the width of the first sub-trench 231 in the first direction X. Thus, the size of the subsequently formed first divided trench in the first direction X may be smaller than the width of the first sub-trench 231 in the first direction X, and the width of the second sub-trench in the first direction may be smaller than the size of the first divided trench in the first direction X. After the patterns of the second sub-trench and the first sub-trench are subsequently transferred to the first middle trench, the size of the first divided trench in the first direction may be smaller than the width of the first middle trench at the bottom of the first sub-trench in the first direction, and the width of the first middle trench at the bottom of the second sub-trench in the first direction may be smaller than the size of the first divided trench in the first direction. After subsequently forming the first divided filling layer, the first divided filling layer may be capable of separating the first middle trench at the bottom of the first sub-trench and the first middle trench at the bottom of the second sub-trench.

The first photolithography opening 243 may be disposed over a second portion of the first sub-trench 231, and may also be extended to the second mask layer 230 over the second sub-trench region in the second direction Y. Therefore, the size of the first photolithography opening 243 in the second direction Y may be made substantially large, which may reduce the challenges on the photolithography process, and reduce the process difficulty. In one embodiment, the first photolithography opening 243 may have a size in the second direction Y in a range of approximately 65 nm-1000 nm, e.g., 80 nm, 100 nm, 200 nm, or 500 nm.

In one embodiment, for the first photolithography openings 243 disposed in adjacent first regions A1, an area of the overlapped region between each first photolithography opening 243 and first sub-trench may be different. Accordingly, the size of the subsequently formed first divided trench in each first region in the second direction may be different, and the size of the first divided filling layer in each first region in the second direction may be different. Therefore, the size of the first divided filling layer in the second direction may be in a different range, and the process window of the first divided filling layer may be substantially large.

In certain embodiments, for the first photolithography openings disposed in adjacent first regions, an area of the overlapped region between each first photolithography opening and first sub-trench may be the same. Accordingly, the size of the subsequently formed first divided trench in each first region in the second direction may be the same, and the size of the first divided filling layer in each first region in the second direction may be the same. In other words, for any one first photolithography opening over the first region, the area of the overlapped region between the first photolithography opening and the first sub-trench may be the same, and the size of any first divided filling layer in each first region in the second direction may be the same.

Figure 13:
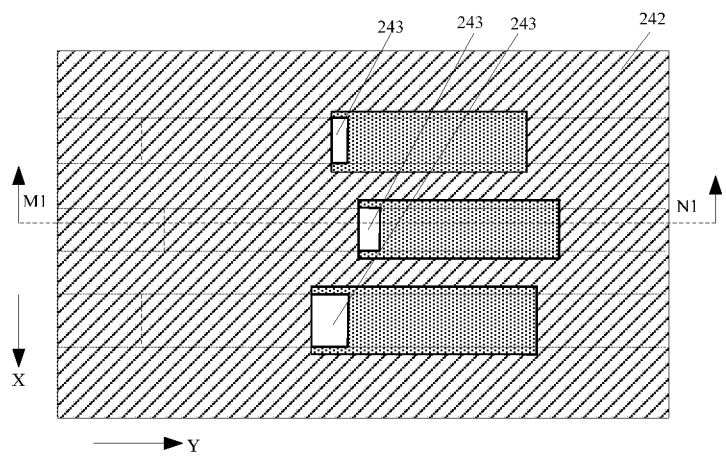
Figure 14:
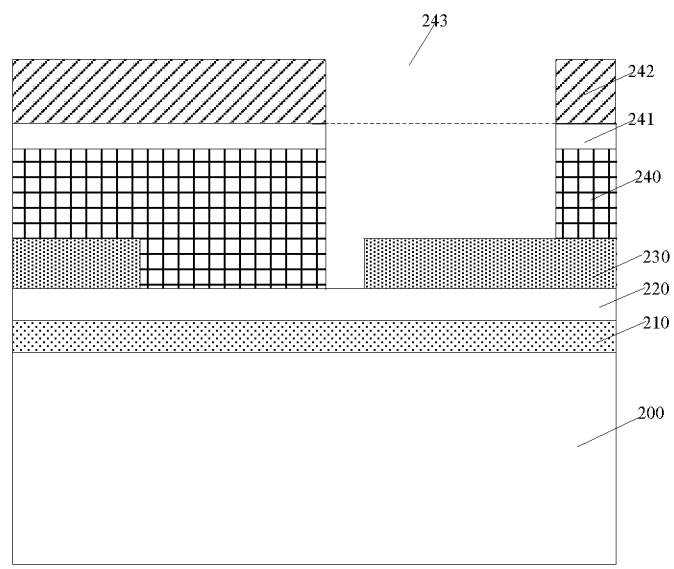

Returning to FIG. 48, after forming the first photolithography opening, the first bottom anti-reflective layer and the first planarization layer at the bottom of the first photolithography opening may be removed (S105). FIGS. 13-14 illustrate a corresponding semiconductor structure. FIG. 13 illustrates a schematic diagram formed on the basis of FIG. 11, FIG. 14 illustrates a schematic diagram formed on the basis of FIG. 12, and FIG. 14 illustrates a cross-sectional view along a line 'M1-N1' in FIG. 13.

Referring to FIGS. 13-14, by using the first photolithography mask layer 242 as a mask, the first bottom anti-reflective layer 241 and the first planarization layer 240 at the bottom of the first photolithography opening 243 may be removed by etching to expose a top surface of the second mask layer 230 and a surface of the first mask layer 220.

Figure 15:
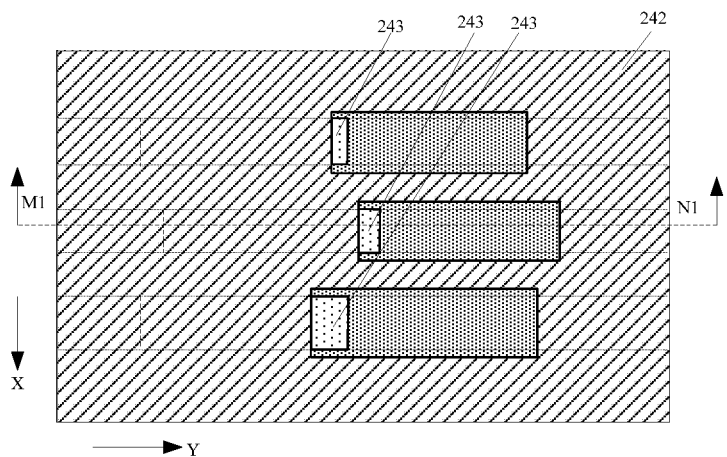
Figure 16:
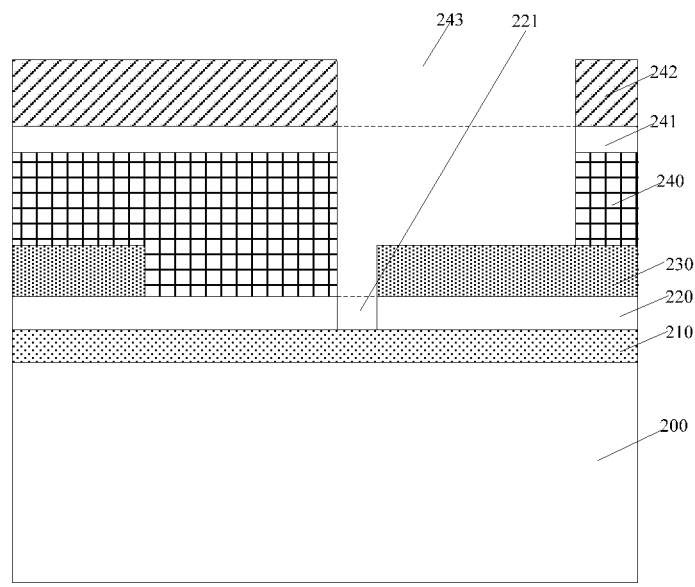

Returning to FIG. 48, after removing the first bottom anti-reflective layer and the first planarization layer at the bottom of the first photolithography opening, a first divided trench may be formed (S106). FIGS. 15-16 illustrate a corresponding semiconductor structure. FIG. 15 illustrates a schematic diagram formed on the basis of FIG. 13, FIG. 16 illustrates a schematic diagram formed on the basis of FIG. 14, and FIG. 16 illustrates a cross-sectional view along a line 'M1-N1' in FIG. 15.

Referring to FIGS. 15-16, by using the first photolithography mask layer 242 and the second mask layer 230 as a mask, the first mask layer 220 may be etched to form a first divided trench 221 in the first mask layer 220 over the first region A1. The first divided trench 221 may be disposed at a bottom of an edge of the first sub-trench 231 in the second direction Y.

For illustrative purposes, the first mask layer 220 at the bottom of the first sub-trench 231 may include a first middle region and first edge regions, and the first edge regions may be disposed on both sides of the first middle region in the second direction, respectively. The first divided trench 221 may be disposed in the first mask layer 220 in a first edge region on a side of the first middle region.

In one embodiment, by using the first photolithography mask layer 242 and the second mask layer 230 as a mask, the first mask layer 220 at the bottom of the overlapped region between the first photolithography opening 243 and the first sub-trench 231 may be etched to form the first divided trench 221 disposed in the first mask layer 220 at the bottom of the overlapped region between the first photolithography opening 243 and the first sub-trench 231.

The size of the first divided trench 221 in the first direction X may be limited by the width of the first sub-trench 231 in the first direction X, and, thus, the first divided trench 221 may have a substantially small size in the first direction X. Because the size of the first divided trench 221 in the second direction Y desires to be limited by the size of the overlapped region between the first photolithography opening 243 and the first sub-trench 231 in the second direction Y, the first divided trench 221 may have a substantially small size in the second direction Y. Therefore, the first divided trench 221 may have substantially small size in the first direction X and in the second direction Y, respectively, which may satisfy the requirements of the process design.

In one embodiment, the size of the first divided trench 221 in the first direction X may be in a range of approximately 10 nm-60 nm. In one embodiment, the first divided trench 221 formed in each first region may have a different size in the second direction Y. In certain embodiments, the first divided trench 221 formed in each first region may have a same size in the second direction Y. The size of the first divided trench 221 in the second direction Y may be in a range of approximately 10 nm-40 nm.

In one embodiment, the first divided trench 221 may not be extended to the second region. Therefore, the first divided trench 221 may not affect the position at which the subsequently formed second trench is cut.

Figure 17:
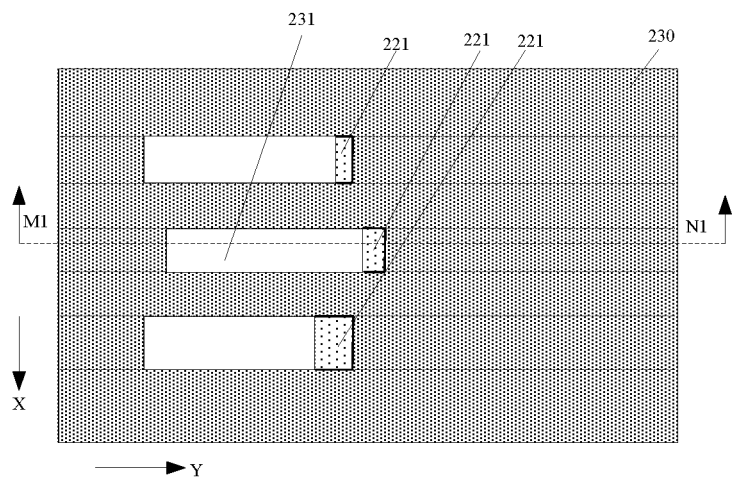
Figure 18:
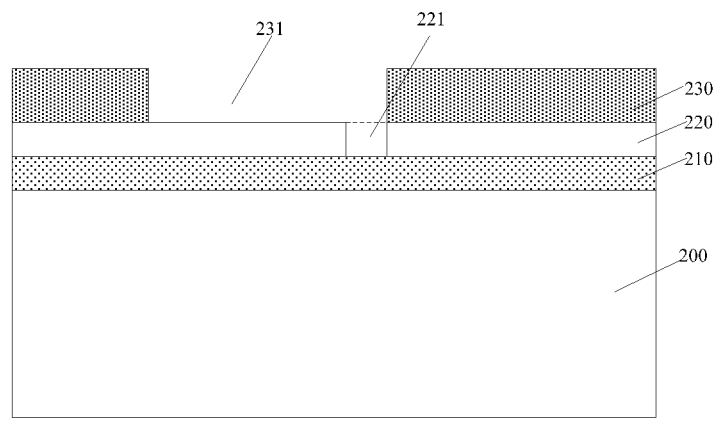

Returning to FIG. 48, after forming the first divided trench, the first photolithography mask layer may be removed (S107). FIGS. 17-18 illustrate a corresponding semiconductor structure. FIG. 17 illustrates a schematic diagram formed on the basis of FIG. 15, FIG. 18 illustrates a schematic diagram formed on the basis of FIG. 16, and FIG. 18 illustrates a cross-sectional view along a line 'M1-N1' in FIG. 17.

Referring to FIGS. 17-18, after forming the first divided trench 221, the first photolithography mask layer 242 may be removed. When removing the first photolithography mask layer 242, the first bottom anti-reflective layer 241 and the first planarization layer 240 may be removed.

Figure 19:
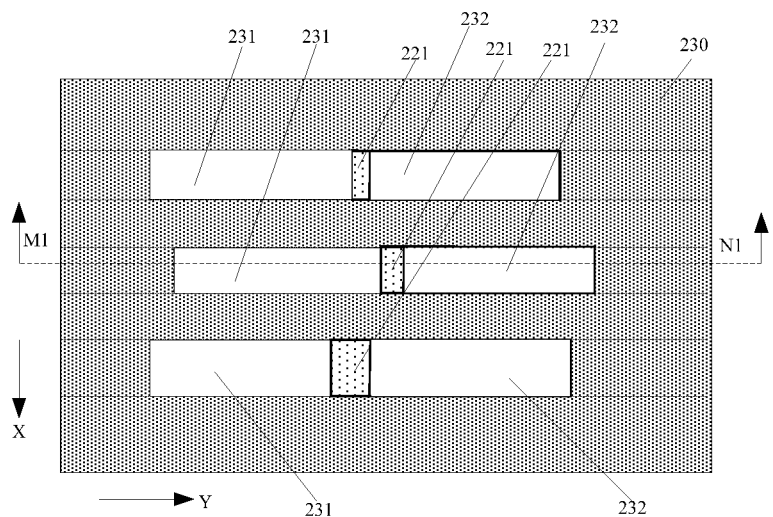
Figure 20:
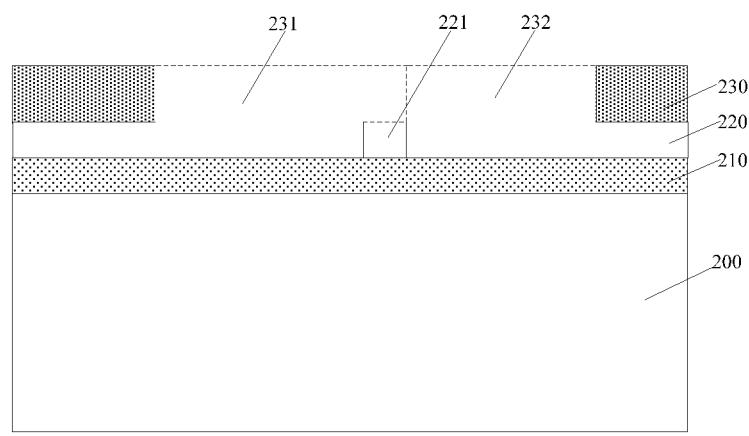

Returning to FIG. 48, after removing the first photolithography mask layer, a second sub-trench may be formed (S108). FIGS. 19-20 illustrate a corresponding semiconductor structure. FIG. 19 illustrates a schematic diagram formed on the basis of FIG. 17, FIG. 20 illustrates a schematic diagram formed on the basis of FIG. 18, and FIG. 20 illustrates a cross-sectional view along a line 'M1-N1' in FIG. 19.

Referring to FIGS. 19-20, after removing the first photolithography mask layer 242, the second mask layer 230 over the second sub-trench region may be removed by etching to form a second sub-trench 232 disposed over the second sub-trench region in the second mask layer 230 over the first region A1. The second sub-trench 232 and the first sub-trench 231 may be connected to form a first trench.

Forming the second sub-trench 232 may include a dry etching process, e.g., an anisotropic dry etching process. An extension direction of the second sub-trench 232 may be parallel to the second direction Y. The second sub-trench 232 may have a width in the first direction X in a range of approximately 10 nm-60 nm.

Figure 21:
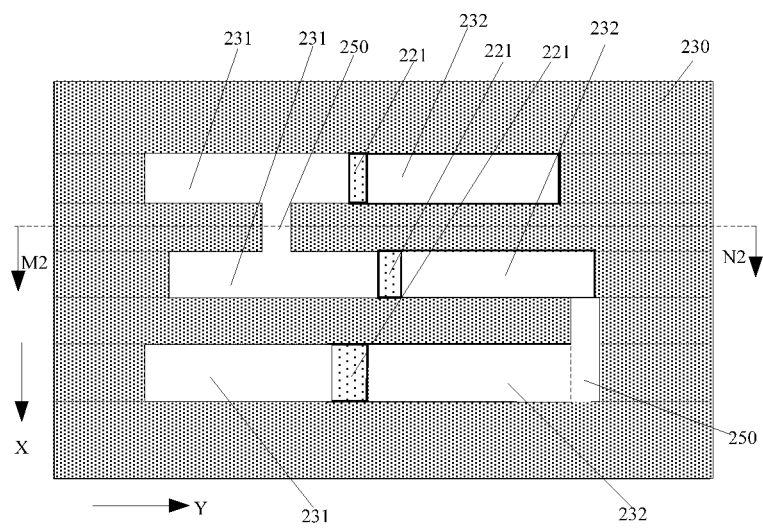
Figure 22:
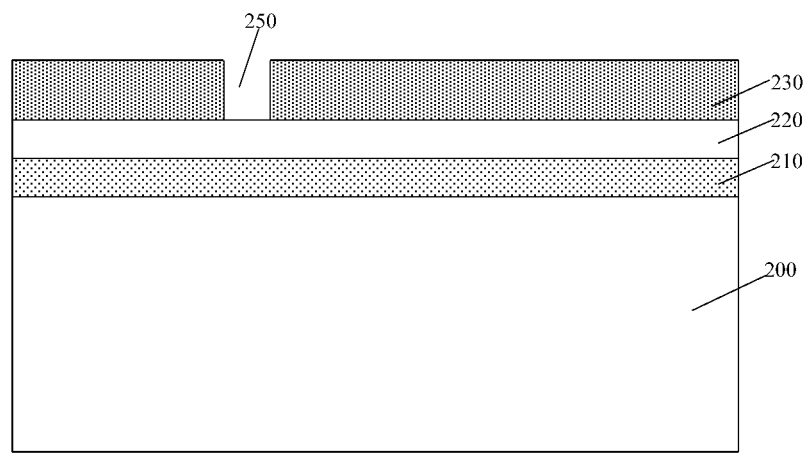

Returning to FIG. 48, after forming the second sub-trench, a second divided trench may be formed (S109). FIGS. 21-22 illustrate a corresponding semiconductor structure. FIG. 21 illustrates a schematic diagram formed on the basis of FIG. 19, FIG. 22 illustrates a schematic diagram formed on the basis of FIG. 20, and FIG. 22 illustrates a cross-sectional view along a line 'M1-N1' in FIG. 21.

Referring to FIGS. 21-22, a second divided trench 250 may be formed in the second mask layer 230 over the second region A2. The second divided trench 250 may divide the second mask layer 230 over the second region A2 in the second direction Y. In one embodiment, after forming the second sub-trench 232, the second divided trench 250 may be formed. In certain embodiments, before forming the first sub-trench, the second divided trench may be formed in the second mask layer over the second region.

The second divided trench 250 may have a substantially small size in the second direction Y. In one embodiment, the second divided trench 250 may have a size in the second direction Y in a range of approximately 10 nm-40 nm. The second divided trench 250 may be extended to the second mask layer 230 over the first region A1. One or more second divided trenches 250 may be connected to the first trench, and one or more second divided trenches 250 may be separated from the first trench. FIG. 21 merely illustrates a case where the second divided trench 250 is connected to the first trench.

The method for forming the second divided trench 250 may include forming a second planarization layer on the second mask layer 230 and in and over the first trench; forming a second bottom anti-reflective layer on the second planarization layer; and forming a patterned second photoresist layer on the second bottom anti-reflective layer. The second photoresist layer may have a second photolithography opening. The second photolithography opening may be disposed in a portion of the second region, and may be further extended to the first region. The method may also include by using the second photoresist layer as a mask, removing the second bottom anti-reflective layer and the second planarization layer at the bottom of the second photolithography opening. In addition, the method may include by using the second photoresist layer as a mask, etching the second mask layer at the bottom of the second photolithography opening to form the second divided trench 250 in the second mask layer. Further, the method may include removing the second photoresist layer, the second bottom anti-reflective layer and the second planarization layer.

For the second divided trench extended to the second mask layer 230 over the first region A1 and separated from the first trench, the size of the second divided trench 250 in the first direction X may be substantially large. The second divided trench 250 may have a size in the first direction X larger than a size in the second direction. Therefore, the second divided trench 250 may desire to have a substantially small size in the second direction Y, and the process difficulty for forming the second divided trench 250 may be reduced.

For the second divided trench connected to the first trench and disposed between adjacent first trenches in the first direction, the second photolithography opening corresponding to the second divided trench may be further extended to the first trench. The second photolithography opening may have a size in the first direction larger than a size in the second direction. The second photolithography opening may desire to have a substantially small size in the second direction, and the process difficulty for forming the second photolithography opening may be reduced.

Figure 23:
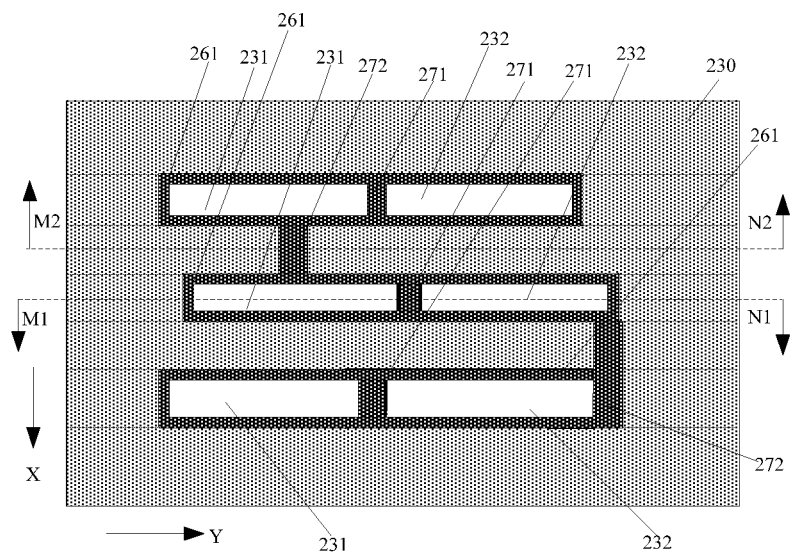
Figure 24:
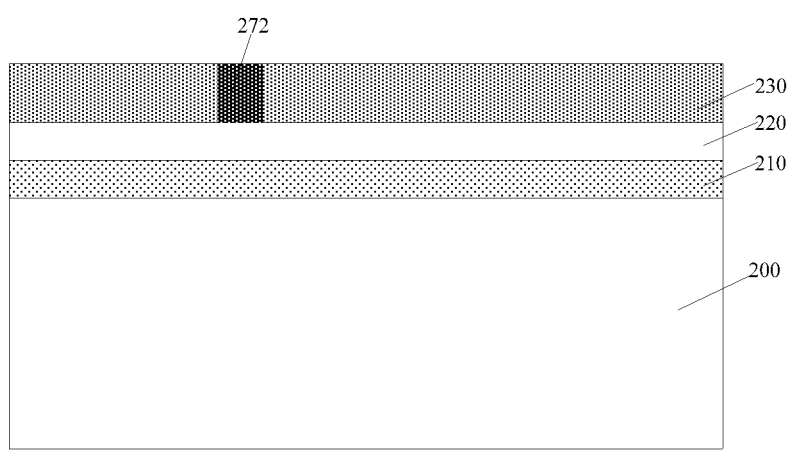
Figure 25:
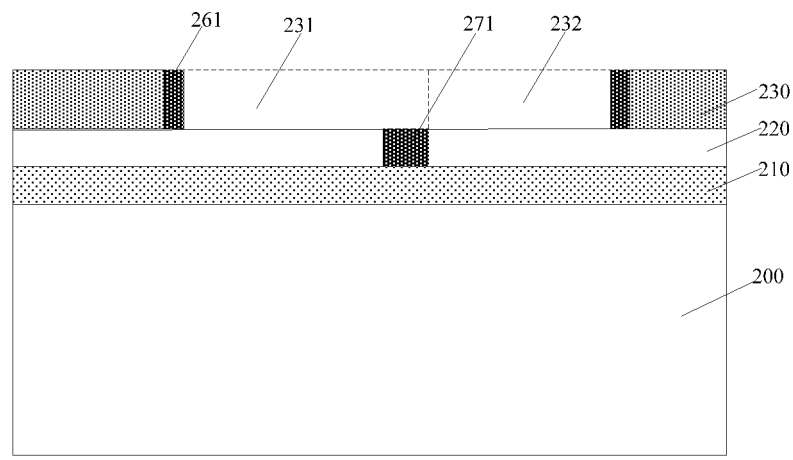

Returning to FIG. 48, after forming the second divided trench, a first divided filling layer may be formed (S110). FIGS. 23-25 illustrate a corresponding semiconductor structure. FIG. 23 illustrates a schematic diagram formed on the basis of FIG. 21, FIG. 24 illustrates a schematic diagram formed on the basis of FIG. 22, FIG. 24 illustrates a cross-sectional view along a line 'M2-N2' in FIG. 23, and FIG. 25 illustrates a cross-sectional view along a line 'M1-N1' in FIG. 23.

Referring to FIGS. 23-25, after forming the first trench, a first divided filling layer 271 may be formed in the first divided trench 221. In one embodiment, after forming the second divided trench 250 and the second sub-trench 232, a mask sidewall spacer 261 may be formed on a sidewall of the first trench. When forming the mask sidewall spacer 261, the first divided filling layer 271 may be formed in the first divided trench 221, and a second divided filling layer 272 may be formed in the second divided trench 250.

A distance between a projection pattern of the first divided filling layer 271 on the surface of the layer to-be-etched and a projection pattern of the second divided filling layer 272 on the surface of the layer to-be-etched in the second direction Y may be greater than zero. In other words, the projection pattern of the first divided filling layer 271 on the surface of the layer to-be-etched and the projection pattern of the second divided filling layer 272 on the surface of the layer to-be-etched may be shifted from each other in the second direction Y.

In one embodiment, the size of the first divided trench 221 in the second direction Y may be less than or equal to twice a thickness of the mask sidewall spacer 261. The size of the first divided filling layer 271 in the second direction Y may be less than or equal to twice the thickness of the mask sidewall spacer 261. Therefore, the first divided trench 221 may be fully filled with the first divided filling layer 271.

In one embodiment, the size of the second divided trench 250 in the second direction Y may be less than or equal to twice the thickness of the mask sidewall spacer 261. The size of the second divided filling layer 272 in the second direction Y may be less than or equal to twice the thickness of the mask sidewall spacer 261. Therefore, the second divided trench 250 over the second region A2 may be fully filled with the second divided filling layer 272.

In one embodiment, the method for forming the first divided filling layer 271, the second divided filling layer 272, and the mask sidewall spacer 261 may include forming a divided filling film on a sidewall and at bottom of the first trench, in the first divided trench 221, in the second divided trench 250, and on the second mask layer 230. The method may also include back-etching the divided filling film until a top surface of the second mask layer 230 and a top surface of the first mask layer 220 at the bottom of the first trench are exposed, to form the first divided filling layer 271, the second divided filling layer 272, and the mask sidewall spacer 261.

In one embodiment, the first divided filling layer 271, the second divided filling layer 272, and the mask sidewall spacer 261 may be formed in a same process, thereby simplifying the processes.

The first divided filling layer 271, the first mask layer 220, and the second mask layer 230 may be made of materials different from each other. The second divided filling layer 272, the first mask layer 220, and the second mask layer 230 may be made of materials different from each other. The mask sidewall spacer 261, the first mask layer 220, and the second mask layer 230 may be made of materials different from each other.

The first divided filling layer 271 may be made of a material including $SiO_2$, SiN, $TiO_2$, TiN, AlN or $Al_2O_3$. In one embodiment, the first divided filling layer 271, the second divided filling layer 272, and the mask sidewall spacer 261 may be made of a same material. In certain embodiments, the first divided filling layer, the second divided filling layer, and the mask sidewall spacer may be made of materials different from each other.

The size of the first divided filling layer 271 in the first direction X may be limited by the width of the first sub-trench in the first direction X. Therefore, the first divided filling layer 271 may have a substantially small size in the first direction X. In one embodiment, the first divided filling layer 271 may have a size in the first direction in a range of approximately 10 nm-60 nm.

Because the size of the first divided filling layer 271 in the second direction Y desires to be limited by the size of the overlapped region between the first photolithography opening 243 and the first sub-trench in the second direction Y, the first divided filling layer 271 may have a substantially small size in the second direction Y. Therefore, the first divided filling layer 271 may have substantially size in both the first direction X and the second direction Y, which may satisfy the requirements of the process design.

In one embodiment, first divided trenches disposed in adjacent first regions may have a different size in the second direction, and first divided filling layers disposed in adjacent first regions may have a different size in the second direction. Therefore, the size of the divided filling layer in the second direction may be in a different range, such that the process window of the first divided filling layer may be substantially large.

In certain embodiments, the first divided trenches disposed in adjacent first regions may have a same size, and the first divided filling layers disposed in adjacent first regions may have a same size in the second direction. In other words, for any first photolithography opening over the first region, the overlapped region between the first photolithography opening and the first sub-trench region may have a same area, and the first divided filling layers disposed in adjacent first regions may have a same size in the second direction. In one embodiment, the first divided filling layer over the first region may have a size in the second direction in a range of approximately 10 nm-40 nm.

Figure 26:
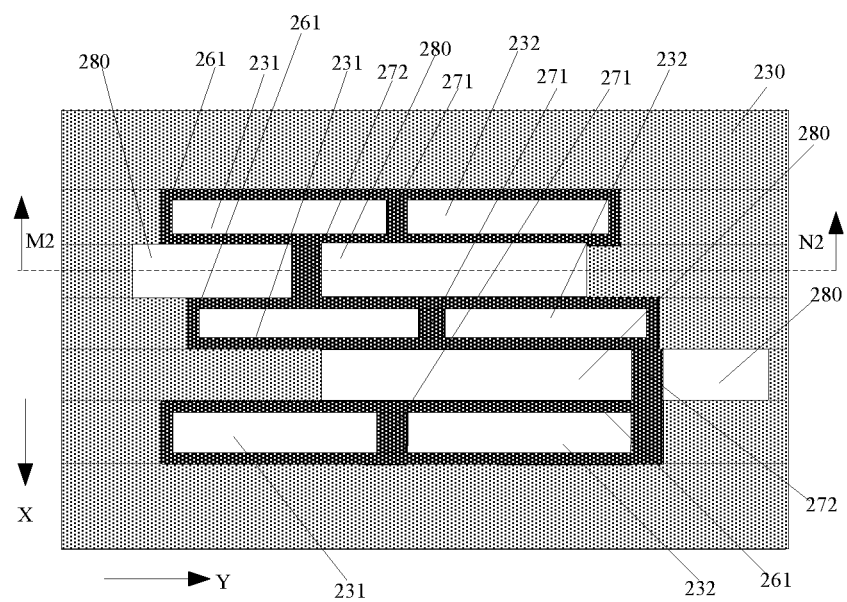
Figure 27:
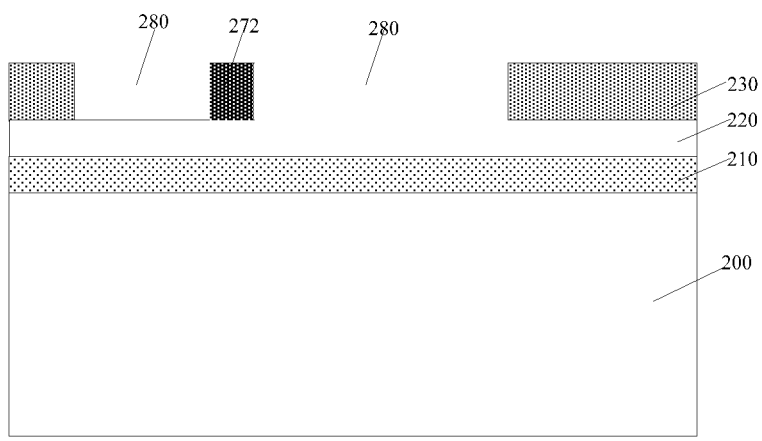

Returning to FIG. 48, after forming the first divided filling layer, a second trench may be formed (S111). FIGS. 26-27 illustrate a corresponding semiconductor structure. FIG. 26 illustrates a schematic diagram formed on the basis of FIG. 23, FIG. 27 illustrates a schematic diagram formed on the basis of FIG. 24, and FIG. 27 illustrates a cross-sectional view along a line 'M2-N2' in FIG. 26.

Referring to FIGS. 26-27, by using the second divided filling layer 272 and the mask sidewall spacer 261 as a mask, the second mask layer 230 over the second region A2 may be etched to form a second trench 280 in the second mask layer 230 over the second region A2. The second divided filling layer 272 may divide the second trench 280 in the second direction Y, and the sidewall of the second trench 280 may expose the mask sidewall spacer 261.

An extension direction of the second trench 280 may be parallel to the second direction Y. The second trench 280 may have a width in the first direction X in a range of approximately 10 nm-60 nm. The second divided filling layer 272 may divide the second trench 280 in the second direction Y. The sidewall of the second trench 280 may expose the mask sidewall spacer 261. The first trench and the second trench 280 may be separated by the mask sidewall spacer 261.

Figure 28:
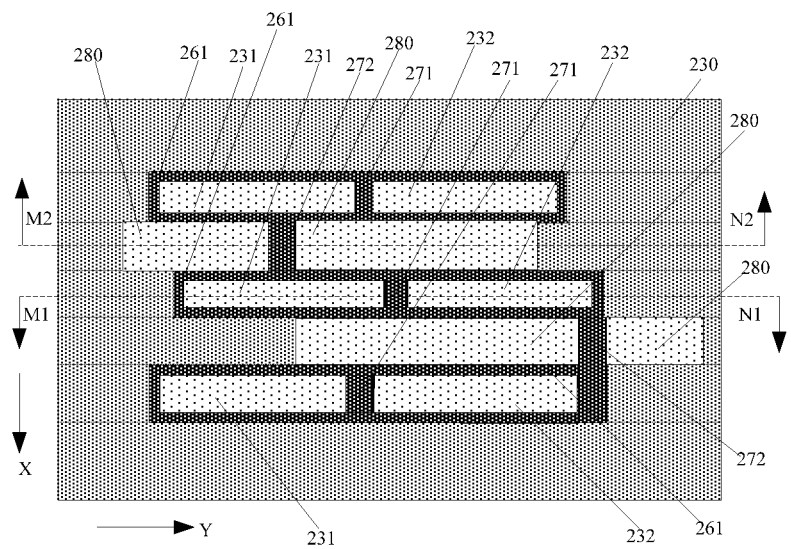
Figure 29:
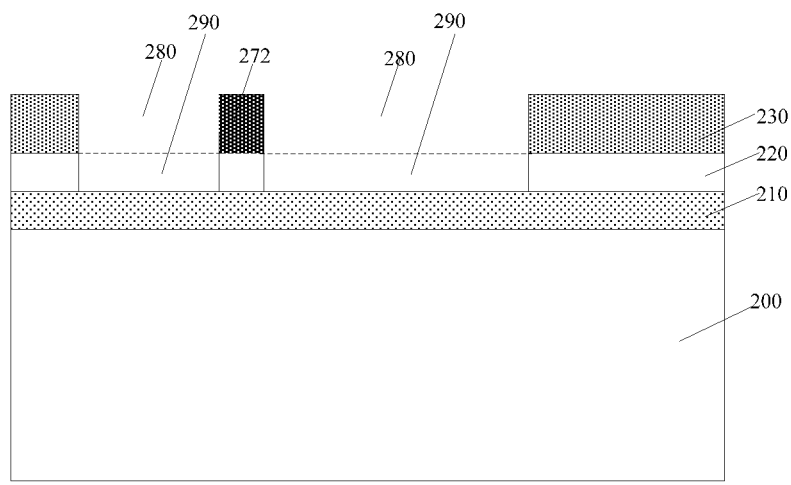
Figure 30:
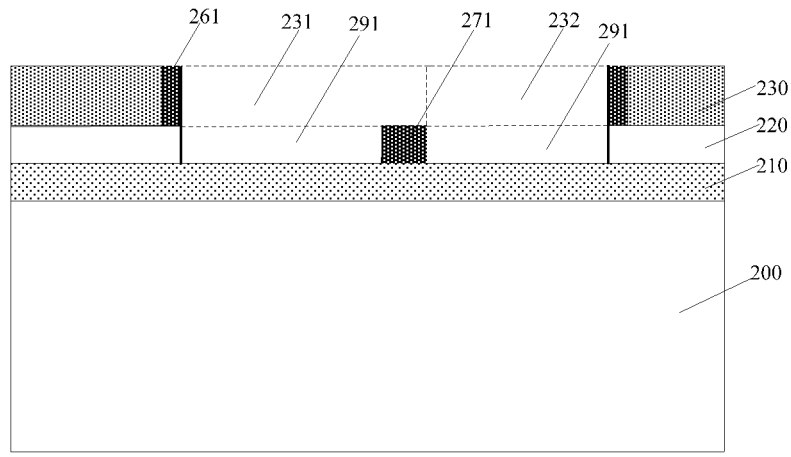

Returning to FIG. 48, after forming the second trench, a first middle trench and a second middle trench may be formed (S112). FIGS. 28-30 illustrate a corresponding semiconductor structure. FIG. 28 illustrates a schematic diagram formed on the basis of FIG. 26, FIG. 29 illustrates a schematic diagram formed on the basis of FIG. 27, FIG. 29 illustrates a cross-sectional view along a line 'M2-N2' in FIG. 28, and FIG. 30 illustrates a cross-sectional view along a line 'M1-N1' in FIG. 28.

Referring to FIGS. 28-30, after forming the second trench 280, by using the second mask layer 230, the mask sidewall spacer 261 and the first divided filling layer 271 as a mask, the first mask layer 220 at the bottom of the first trench may be etched to form a first middle trench 291 in the first mask layer 220 over the first region A1. The first divided filling layer 271 may divide the first middle trench 291 in the second direction Y. By using the second mask layer 230, the second divided filling layer 272 and the mask sidewall spacer 261 as a mask, the first mask layer 220 at the bottom the second trench may be etched to form a second middle trench 290 in the first mask layer 220 over the second region A2. The first mask layer over the second region at the bottom of the second divided filling layer 272 may divide the second middle trench 290 in the second direction Y.

In one embodiment, the second middle trench 290 may be formed when forming the first middle trench 291, which may simplify the process. In another embodiment, after forming the first middle trench 291, the second middle trench may be formed. In certain embodiments, after forming the second middle trench, the first middle trench may be formed.

In one embodiment, the method may also include etching the layer 200 to-be-etched at the bottom of the first middle trench 291 to form a first target trench in the layer 200 to-be-etched, and etching the layer 200 to-be-etched at the bottom of the second middle trench 290 to form a second target trench in the layer 200 to-be-etched. Further, the method may include forming a first conductive layer in the first target trench, and forming a second conductive layer in the second target trench.

In one embodiment, before etching the layer to-be-etched at the bottom of the first middle trench and etching the layer to-be-etched at the bottom of the second middle trench, the bottom hard mask layer and the adhesive layer at the bottom of the first middle trench may be etched to form a first hard mask trench in the bottom hard mask layer at the bottom of the first middle trench. The bottom hard mask layer and the adhesive layer at the bottom of the second middle trench may be etched to form a second hard mask trench in the bottom hard mask layer at the bottom of the second middle trench.

In one embodiment, after etching the bottom hard mask layer and the adhesive layer at the bottom of the first middle trench and etching the bottom hard mask layer and the adhesive layer at the bottom of the second middle trench, and before forming the first conductive layer and the second conductive layer, the first mask layer and the second mask layer may be removed. After removing the first mask layer and the second mask layer, the layer to-be-etched at the bottom of the first hard mask trench may be etched to form the first target trench in the layer to-be-etched. The layer to-be-etched at the bottom of the second hard mask trench may be etched to form the second target trench in the layer to-be-etched. After forming the first target trench and the second target trench, a conductive film may be formed in the first target trench, in the second target trench, and on the bottom hard mask layer. The conductive film may be planarized until the top surface of the bottom hard mask layer is exposed to form the first conductive layer in the first target trench and to form the second conductive layer in the second target trench. Then, the bottom hard mask layer and the adhesive layer may be removed. The first conductive layer and the second conductive layer may be made of a metal, e.g., copper or aluminum.

The present disclosure also provides a semiconductor device formed by any one of the above-disclosed methods.

The present disclosure further provides another method for forming a semiconductor device. The same or similar features of the embodiments in the present disclosure and the embodiments associated with FIGS. 6-30 are not repeated herein, while certain difference may include the following. In the embodiments of the present disclosure, the second region may include a second trench region, and the second trench region may include a third sub-trench region and a fourth sub-trench region. The third sub-trench region may be in contact with an adjacent fourth sub-trench region in the second direction. The second trench region may be in contact with an adjacent first trench region.

The method for forming the semiconductor device may further include the following. Before forming the first middle trench, a mask sidewall spacer may be formed on the sidewall of the first trench. After forming the mask sidewall spacer and the first divided filling layer, a third sub-trench disposed over the third sub-trench region may be formed in the second mask layer over the second region. A second photolithography mask layer may be formed over the second mask layer and a first portion of the third sub-trench, and the second photolithography mask layer may have a second photolithography opening disposed over a second portion of the third sub-trench. The second photolithography opening may be further extended to the second mask layer over the fourth sub-trench region in the second direction.

By using the second photolithography mask layer and the second mask layer as a mask, the first mask layer may be etched to form a second divided trench in the first mask layer over the second region. The second divided trench may be disposed at a bottom of an edge of the third sub-trench in the second direction. After forming the second divided trench, the second photolithography mask layer may be removed. After removing the second photolithography mask layer, the second mask layer over the fourth sub-trench region may be removed by etching to form a fourth sub-trench disposed over the fourth sub-trench region in the second mask layer over the second region. The fourth sub-trench and the third sub-trench may be connected to form a second trench. After forming the second trench, a second divided filling layer may be formed in the second divided trench.

By using the second divided filling layer as a mask, the first mask layer at the bottom of the second trench may be etched to form the second middle trench in the first mask layer over the second region. The second divided filling layer may divide the second middle trench in the second direction. After forming the second divided filling layer, by using the first divided filling layer as a mask, the first mask layer at the bottom of the first trench may be etched to form the first middle trench in the first mask layer over the first region. The first divided filling layer may divide the first middle trench in the second direction.

Figure 49:
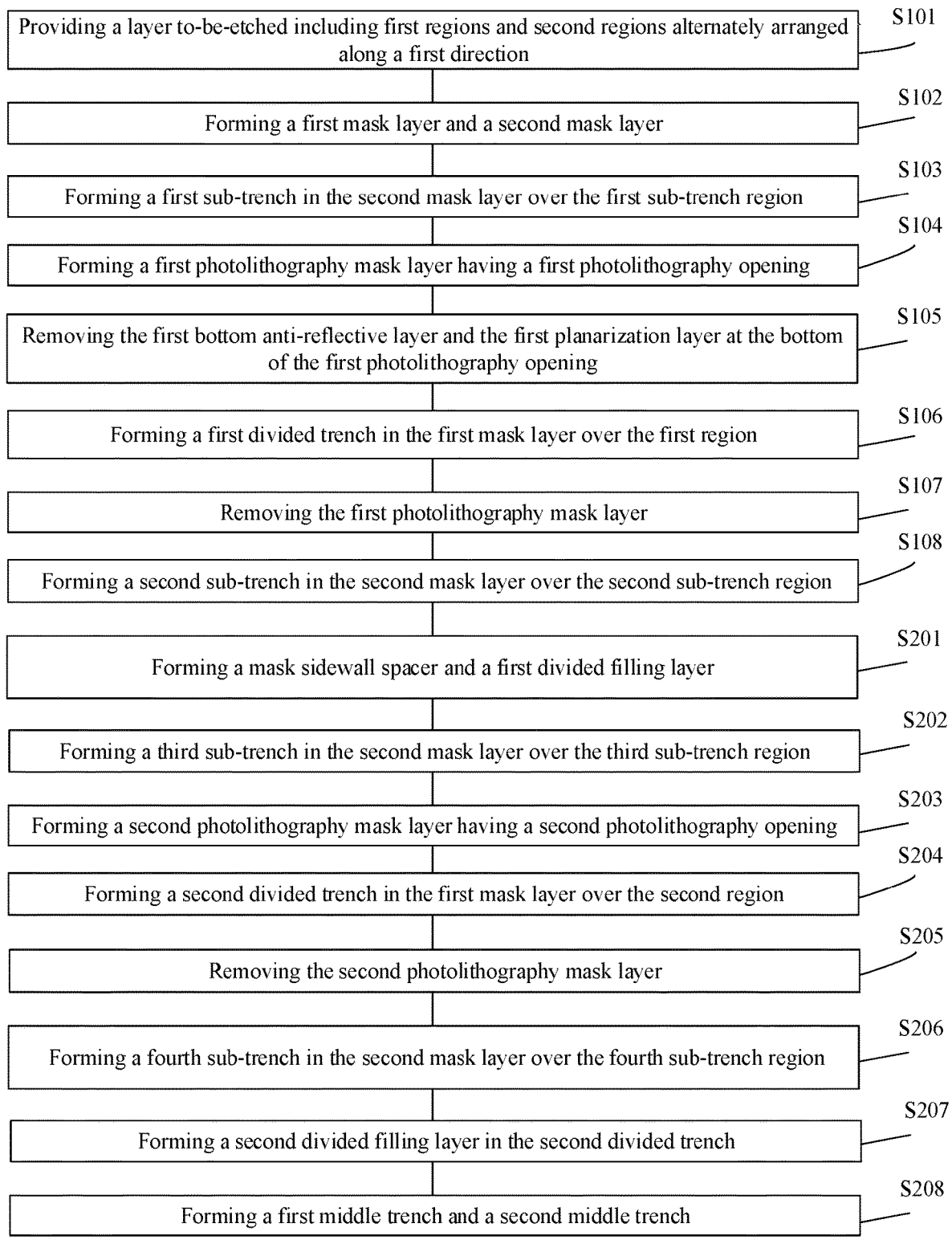
FIG. 49 illustrates another exemplary method for forming a semiconductor device consistent with various disclosed embodiments of the present disclosure.

FIG. 49 illustrates another exemplary method for forming a semiconductor device consistent with various disclosed embodiments of the present disclosure; and FIGS. 31-47 illustrate semiconductor structures corresponding to certain stages of the exemplary fabrication method.

Figure 31:
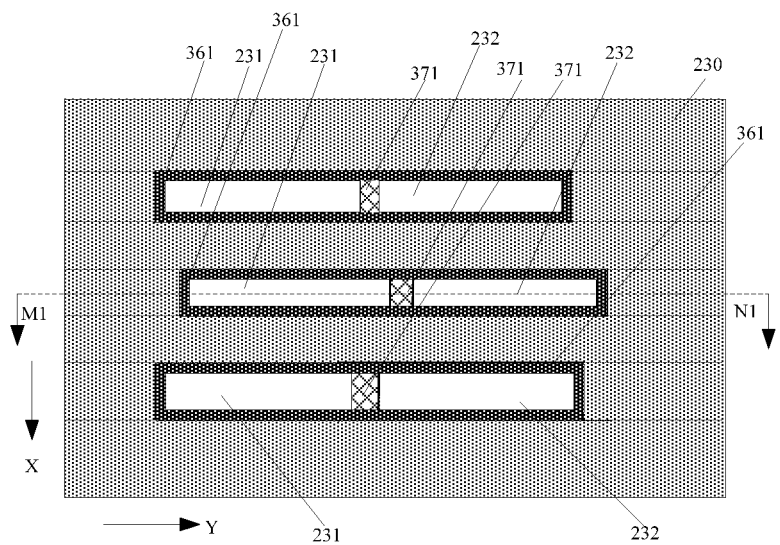
FIGS. 31-47 illustrate semiconductor structures corresponding to certain stages for forming another exemplary semiconductor device consistent with various disclosed embodiments of the present disclosure.
Figure 32:
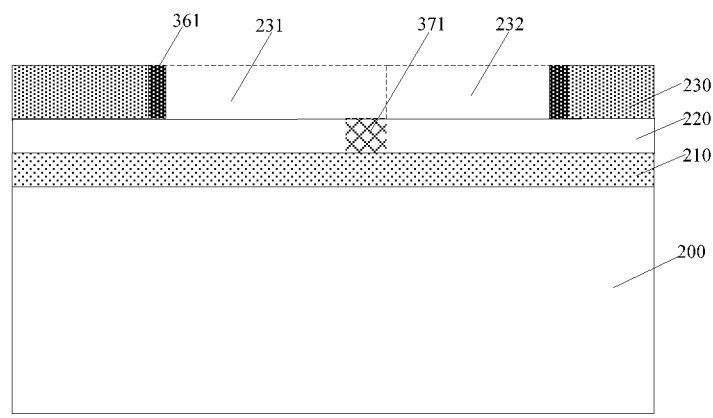

As shown in FIG. 49, after forming the second sub-trench, a mask sidewall spacer and a first divided filling layer may be formed (S201). FIGS. 31-32 illustrate a corresponding semiconductor structure. FIG. 31 illustrates a schematic diagram formed on the basis of FIG. 19, FIG. 32 illustrates a schematic diagram formed on the basis of FIG. 20, and FIG. 32 illustrates a cross-sectional view along a line 'M1-N1' in FIG. 31.

Referring to FIGS. 31-32, a mask sidewall spacer 361 may be formed on a sidewall of the first trench, and a first divided filling layer 371 may be formed in the first divided trench 221.

In one embodiment, the mask sidewall spacer 361 may be formed after forming the first divided filling layer 371. The size of the first divided filling layer 371 in the second direction may not be limited by the thickness of the mask sidewall spacer 361. The method for forming the first divided filling layer 371 may include forming a first divided film in the first trench, in the first divided trench 221, and on the second mask layer. The method may also include back-etching the first divided film to remove the first divided film on the second mask layer and the first divided film in the first trench, thereby forming the first divided filling layer 371. The method for forming the mask sidewall spacer 361 may include forming a sidewall spacer film at the bottom and on the sidewall of the first trench, on a surface of the first divided filling layer 371, and on the top surface of the second mask layer. The method may also include back-etching the sidewall spacer film until the top surface of the second mask layer, the surface of the first mask layer, and the surface of the first divided filling layer 371 are exposed to form the mask sidewall spacer 361.

In another embodiment, the size of the first divided filling layer in the second direction may be less than twice the thickness of the mask sidewall spacer, and the first divided filling layer may be formed when forming the mask sidewall spacer. The method may include forming a sidewall spacer film at the bottom and on the sidewall of the first trench, in the first divided trench, and on the top surface of the second mask layer. The method may also include back-etching the sidewall spacer film until the top surface of the second mask layer and the surface of the first mask layer are exposed, to form the first divided filling layer and the mask sidewall spacer.

Figure 33:
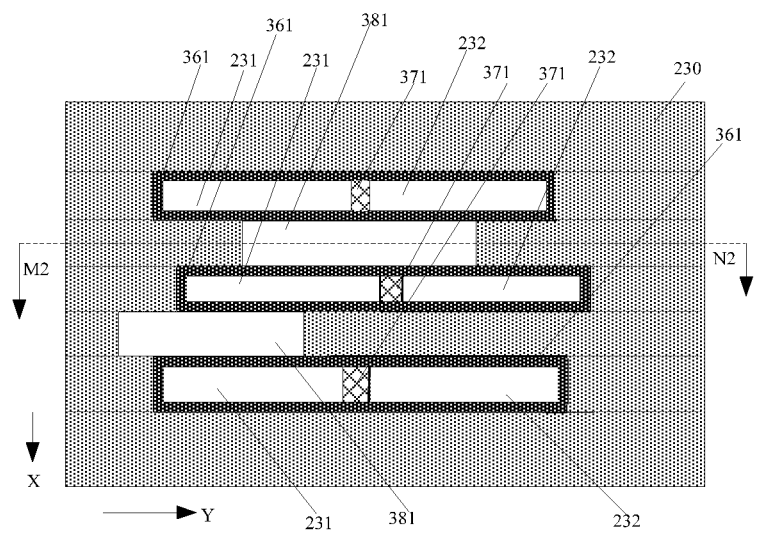
Figure 34:
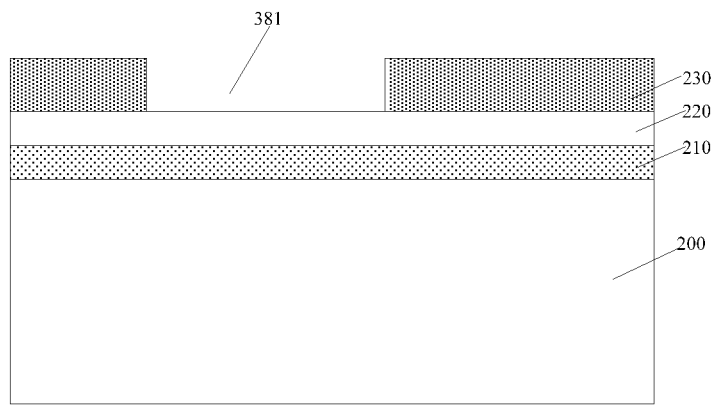

Returning to FIG. 49, after forming the first divided filling layer and the mask sidewall spacer, a third sub-trench may be formed (S202). FIGS. 33-34 illustrate a corresponding semiconductor structure. FIG. 33 illustrates a schematic diagram formed on the basis of FIG. 31, and FIG. 34 illustrates a cross-sectional view along a line 'M2-N2' in FIG. 33.

Referring to FIGS. 33-34, after forming the mask sidewall spacer 361 and the first divided filling layer 371, a third sub-trench 381 disposed over the third sub-trench region may be formed in the second mask layer 230 over the second region A2.

An extension direction of the third sub-trench 381 may be parallel to the second direction Y. The second direction Y may be perpendicular to the first direction X. The third sub-trench 381 may have a width in the first direction X in a range of approximately 10 nm-60 nm. A spacing between adjacent third sub-trenches 381 in the first direction X may be in a range of approximately 10 nm-60 nm. Forming the third sub-trench 381 may include a dry etching process, e.g., an anisotropic dry etching process.

Figure 35:
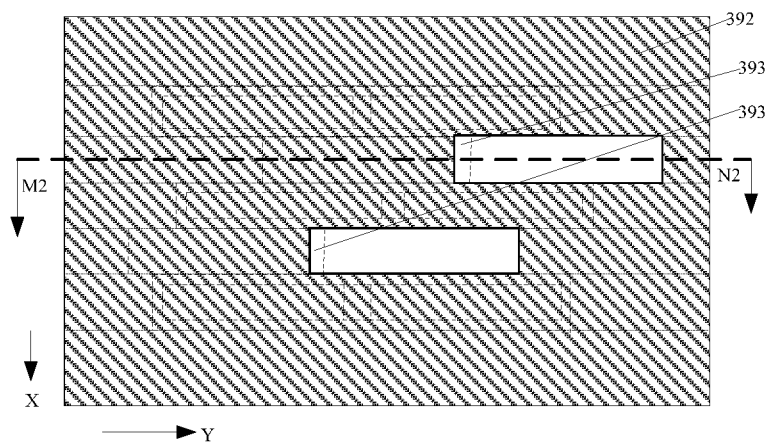
Figure 36:
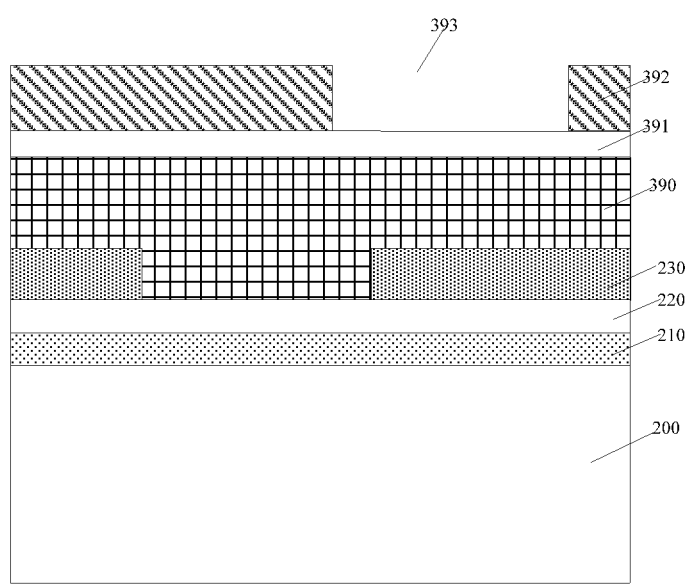

Returning to FIG. 49, after forming the third sub-trench, a second photolithography opening may be formed (S203). FIGS. 35-36 illustrate a corresponding semiconductor structure. FIG. 35 illustrates a schematic diagram formed on the basis of FIG. 33, and FIG. 36 illustrates a cross-sectional view along a line 'M2-N2' in FIG. 35.

Referring to FIGS. 35-36, a second photolithography mask layer 392 may be formed over the second mask layer 230 and a first portion of the third sub-trench 381. The second photolithography mask layer 392 may have a second photolithography opening 393 disposed over a second portion of the third sub-trench. The second photolithography opening 393 may be extended to the second mask layer 230 over the fourth sub-trench region in the second direction.

In one embodiment, a second planarization layer 390 may be formed on the second mask layer 230, and in and over the third sub-trench 381. A second bottom anti-reflective layer 391 may be formed on the second planarization layer 390. A patterned second photolithography mask layer 392 may be formed on the second bottom anti-reflective layer 391, and the second photolithography mask layer 392 may be disposed over the second mask layer 230 and a first portion of the third sub-trench 381.

An extension direction of the second photolithography opening 393 may be parallel to the second direction Y. An overlapped region between the second photolithography opening 393 and the third sub-trench 381 may be used to define a position of a subsequently formed second divided filling layer.

In one embodiment, a width of the second photolithography opening 393 in the first direction X may be greater than a width of the third sub-trench 381 in the first direction X. Thus, the size of the subsequently formed second divided filling layer in the first direction X may be limited by the width of the third sub-trench 381 in the first direction X. When the width of the second photolithography opening 393 in the first direction X is greater than the width of the third sub-trench 381 in the first direction X, the width of the second photolithography opening 393 in the first direction X may be close to the width of the third sub-trench 381 in the first direction X.

In another embodiment, the width of the second photolithography opening 393 in the first direction X may be equal to the width of the third sub-trench 381 in the first direction X. Thus, the size of the subsequently formed second divided filling layer in the first direction X may be limited by the width of the third sub-trench 381 in the first direction X. In view of this, the second photolithography opening 393 extended to the second mask layer 230 over the fourth sub-trench region may be used to define a position of a fourth sub-trench subsequently formed by etching the second mask layer over the fourth sub-trench region, which may reduce a quantity of illuminations, simplify the process, and reduce the cost. After the patterns of the third sub-trench and the fourth sub-trench are subsequently transferred to a second middle trench, the second middle trench at the bottom of the third sub-trench in the first direction may have a size equal to the second middle trench at the bottom of the fourth sub-trench in the first direction. The second divided filling layer may be capable of separating the second middle trench at the bottom of the third sub-trench and the second middle trench at the bottom of the fourth sub-trench. In one embodiment, for illustrative purposes, the width of the second photolithography opening 393 in the first direction X is equal to the width of the third sub-trench 381 in the first direction X as an example.

In certain embodiments, the width of the second photolithography opening 393 in the first direction X may be smaller than the width of the third sub-trench 381 in the first direction X. Thus, the size of the subsequently formed second divided trench in the first direction X may be smaller than the width of the third sub-trench 381 in the first direction X, and the width of the fourth sub-trench in the first direction may be smaller than the size of the second divided trench in the first direction X. After the patterns of the fourth sub-trench and the third sub-trench are subsequently transferred to the second middle trench, the size of the second divided trench in the first direction may be smaller than the width of the second middle trench at the bottom of the third sub-trench in the first direction, and the width of the second middle trench at the bottom of the fourth sub-trench in the first direction may be smaller than the size of the second divided trench in the first direction. After subsequently forming the second divided filling layer, the second divided filling layer may be capable of separating the second middle trench at the bottom of the third sub-trench and the second middle trench at the bottom of the fourth sub-trench.

The second photolithography opening 393 may be disposed over a second portion of the third sub-trench 381, and may also be extended to the second mask layer 230 over the fourth sub-trench region in the second direction Y. Therefore, the size of the second photolithography opening 393 in the second direction Y may be made substantially large, which may reduce the challenges on the photolithography process, and reduce the process difficulty. In one embodiment, the second photolithography opening 393 may have a size in the second direction Y in a range of approximately 65 nm-1000 nm, e.g., 80 nm, 100 nm, 200 nm, or 500 nm.

In one embodiment, for the second photolithography openings 393 disposed in adjacent second regions A2, an area of the overlapped region between each second photolithography opening 393 and the third sub-trench may be different. Accordingly, the size of the subsequently formed second divided trench in each second region in the second direction may be different, and the size of the second divided filling layer in each second region in the second direction may be different. Therefore, the size of the second divided filling layer in the second direction may be in a different range, and the process window of the second divided filling layer may be substantially large.

In certain embodiments, for the second photolithography openings disposed in adjacent second regions, an area of the overlapped region between each second photolithography opening and the third sub-trench may be the same. Accordingly, the size of the subsequently formed second divided trench in each second region in the second direction may be the same, and the size of the second divided filling layer in each second region in the second direction may be the same. In other words, for any one second photolithography opening over the second region, the area of the overlapped region between the second photolithography opening and the third sub-trench may be the same, and the size of any second divided filling layer in each second region in the second direction may be the same.

Figure 37:
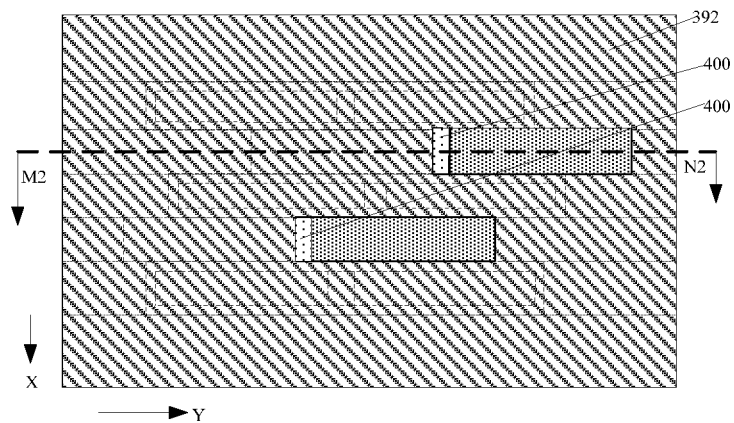
Figure 38:
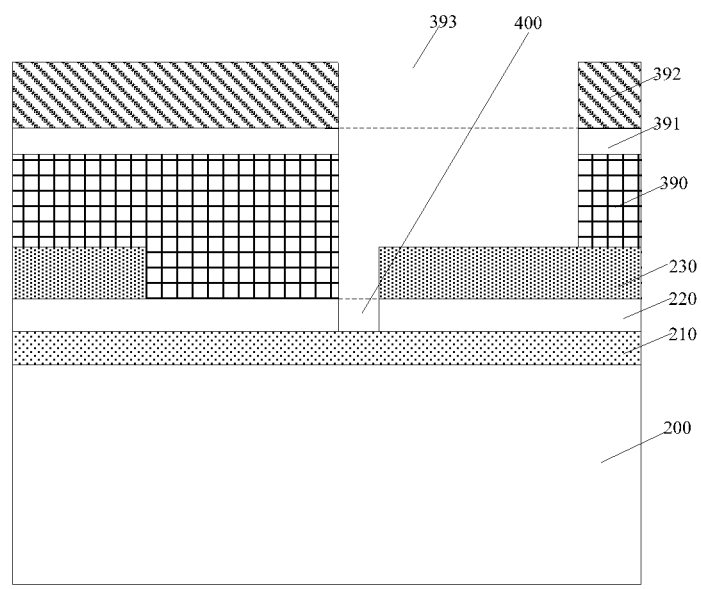

Returning to FIG. 49, after forming the second photolithography opening, a second divided trench may be formed (S204). FIGS. 37-38 illustrate a corresponding semiconductor structure. FIG. 37 illustrates a schematic diagram formed on the basis of FIG. 35, FIG. 38 illustrates a schematic diagram formed on the basis of FIG. 36, and FIG. 38 illustrates a cross-sectional view along a line 'M2-N2' in FIG. 37.

Referring to FIGS. 37-38, by using the second photolithography mask layer 392 as a mask, the second bottom anti-reflective layer 391 and the second planarization layer 390 at the bottom of the second photolithography opening 393 may be removed by etching. Then, using the second photolithography mask layer 392 and the second mask layer 230 as a mask, the first mask layer 220 may be etched to form a second divided trench 400 in the first mask layer 220 over the second region A2. The second divided trench 400 may be disposed at a bottom of an edge of the third sub-trench 381 in the second direction Y.

In one embodiment, by using the second photolithography mask layer 392 and the second mask layer 230 as a mask, the first mask layer 220 at the bottom of the overlapped region between the second photolithography opening 393 and the third sub-trench 381 may be etched to form the second divided trench 400 in the first mask layer 220 at the bottom of the overlapped region between the second photolithography opening 393 and the third sub-trench 381.

The size of the second divided trench 400 in the first direction X may be limited by the width of the third sub-trench 381 in the first direction X, and, thus, the second divided trench 400 may have a substantially small size in the first direction X. Because the size of the second divided trench 400 in the second direction Y desires to be limited by the size of the overlapped region between the second photolithography opening 393 and the third sub-trench 381 in the second direction Y, the second divided trench 400 may have a substantially small size in the second direction Y. Therefore, the second divided trench 400 may have substantially small size in the first direction X and in the second direction Y, respectively, which may satisfy the requirements of the process design.

In one embodiment, the second divided trench 400 may have a size in the first direction X in a range of approximately 10 nm-60 nm. In one embodiment, the second divided trench 400 formed in each second region may have a different size in the second direction Y. In certain embodiments, the second divided trench 400 formed in each second region may have a same size in the second direction Y. The second divided trench 400 may have a size in the second direction Y in a range of approximately 10 nm-40 nm.

In one embodiment, the second divided trench 400 may not be extended to the first region. Therefore, the second divided trench 400 may not affect the position at which the first trench is cut.

Figure 39:
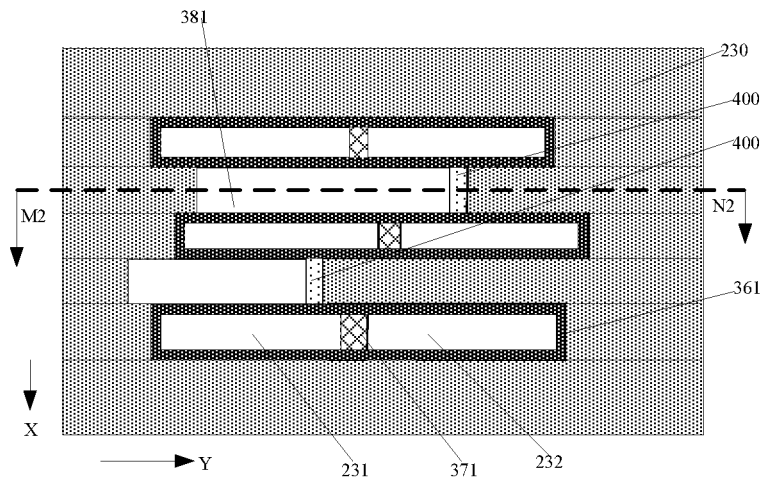
Figure 40:
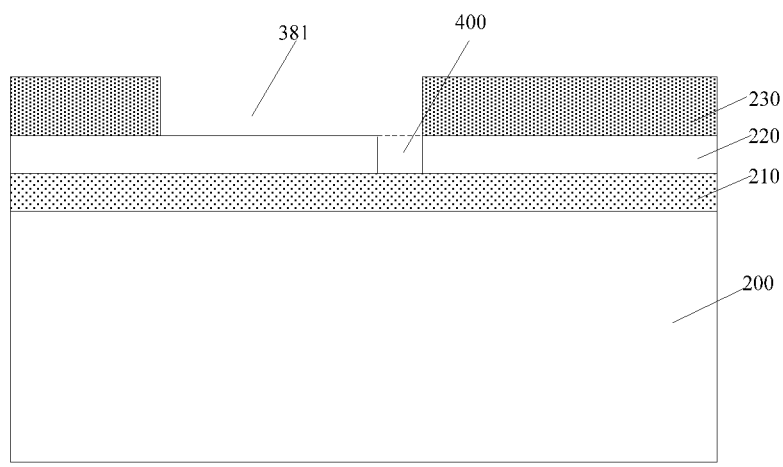

Returning to FIG. 49, after forming the second divided trench, the second photolithography mask layer may be removed (S205). FIGS. 39-40 illustrate a corresponding semiconductor structure. FIG. 39 illustrates a schematic diagram formed on the basis of FIG. 37, FIG. 40 illustrates a schematic diagram formed on the basis of FIG. 38, and FIG. 40 illustrates a cross-sectional view along a line 'M2-N2' in FIG. 39.

Referring to FIGS. 39-40, after forming the second divided trench 400, the second photolithography mask layer 392 may be removed. When removing the second photolithography mask layer 392, the second bottom anti-reflective layer and the second planarization layer may be removed.

Figure 41:
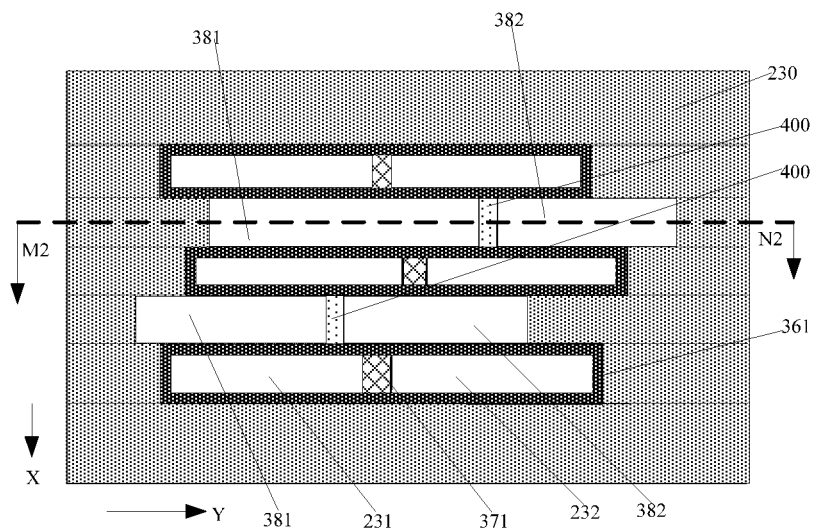
Figure 42:
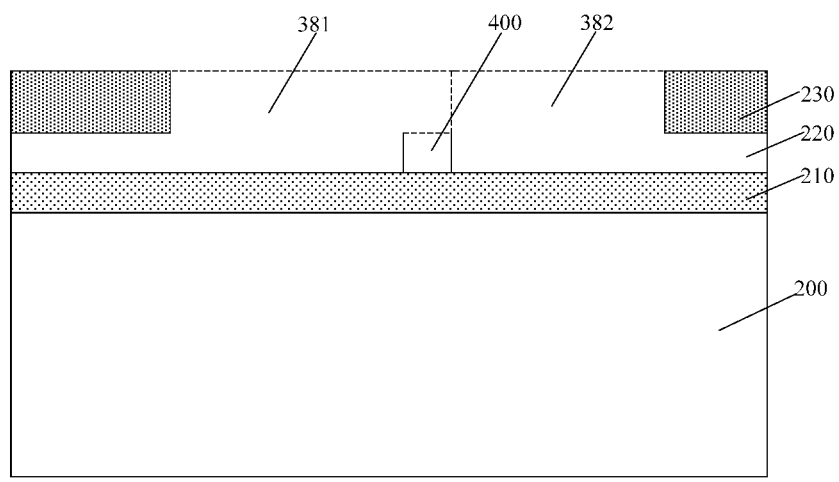

Returning to FIG. 49, after removing the second photolithography mask layer, a fourth sub-trench may be formed (S206). FIGS. 41-42 illustrate a corresponding semiconductor structure. FIG. 41 illustrates a schematic diagram formed on the basis of FIG. 39, FIG. 42 illustrates a schematic diagram formed on the basis of FIG. 40, and FIG. 42 illustrates a cross-sectional view along a line 'M2-N2' in FIG. 41.

Referring to FIGS. 41-42, after removing the second photolithography mask layer 392, the second mask layer 230 over the fourth sub-trench region may be removed by etching to form a fourth sub-trench 382 disposed over the fourth sub-trench region in the second mask layer 230 over the second region A2. The fourth sub-trench 382 and the third sub-trench 381 may be connected to form a second trench.

Forming the fourth sub-trench 382 may include a dry etching process, e.g., an anisotropic dry etching process. An extension direction of the fourth sub-trench 382 may be parallel to the second direction Y. The fourth sub-trench 382 may have a width in the first direction X in a range of approximately 10 nm-60 nm.

In one embodiment, the sidewall of the second trench may expose the mask sidewall spacer 361. In one embodiment, the sidewall of the third sub-trench may expose the mask sidewall spacer 361, and the sidewall of the fourth sub-trench may expose the mask sidewall spacer 361. The first trench and the second trench may be separated by the mask sidewall spacer 361.

Figure 43:
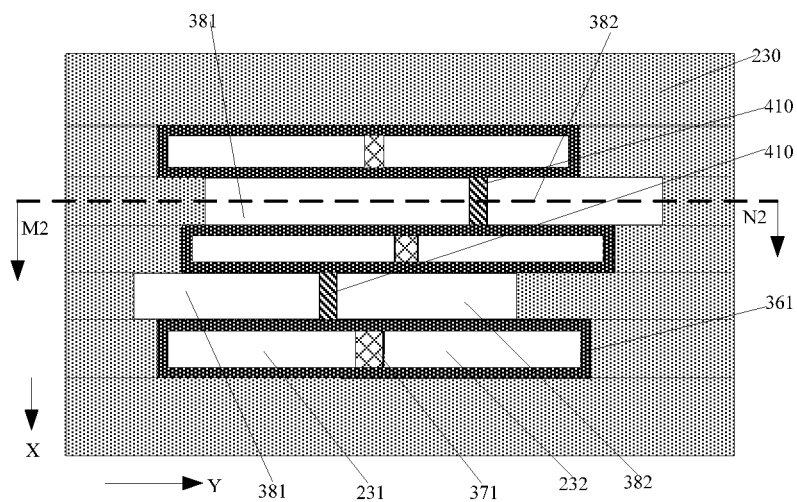
Figure 44:
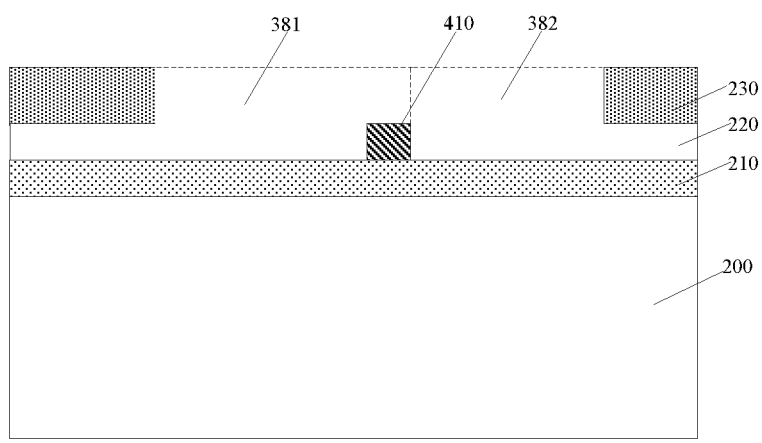

Returning to FIG. 49, after forming the fourth sub-trench, a second divided filling layer may be formed (S207). FIGS. 43-44 illustrate a corresponding semiconductor structure. FIG. 43 illustrates a schematic diagram formed on the basis of FIG. 41, FIG. 44 illustrates a schematic diagram formed on the basis of FIG. 42, and FIG. 44 illustrates a cross-sectional view along a line 'M2-N2' in FIG. 43.

Referring to FIGS. 43-44, after forming the second trench, a second divided filling layer 410 may be formed in the second divided trench 400. A method for forming the second divided filling layer 410 may include forming a second divided film in the second divided trench 400 and in the second trench, and on the second mask layer 230. The method may also include back-etching the second divided film to remove the second divided film in the second trench and the second divided film on the second mask layer 230 to form the second divided filling layer 410.

The material of the second divided filling layer 410 may refer to the material of the second divided filling layer in the above-disclosed disclosure, and the material of the first divided filling layer may refer to the material of the first divided filling layer in the above-disclosed disclosure, which are not repeated herein.

Figure 45:
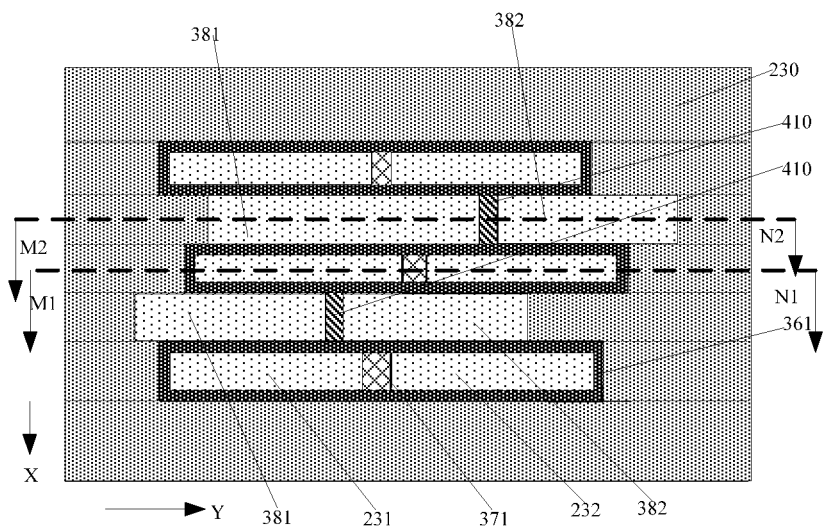
Figure 46:
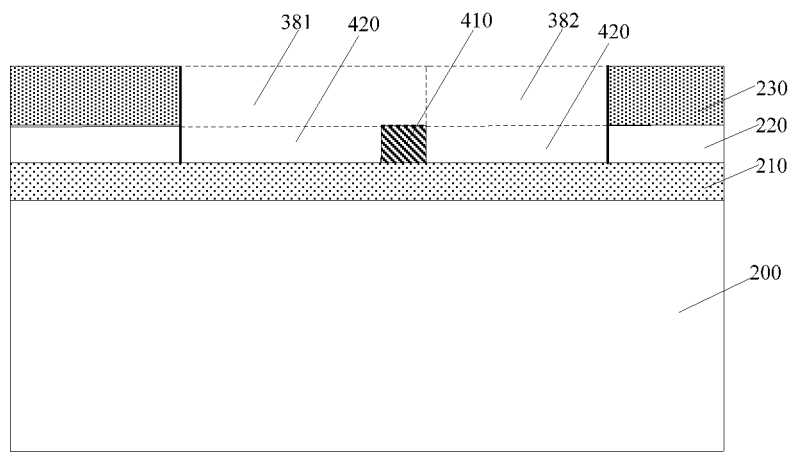
Figure 47:
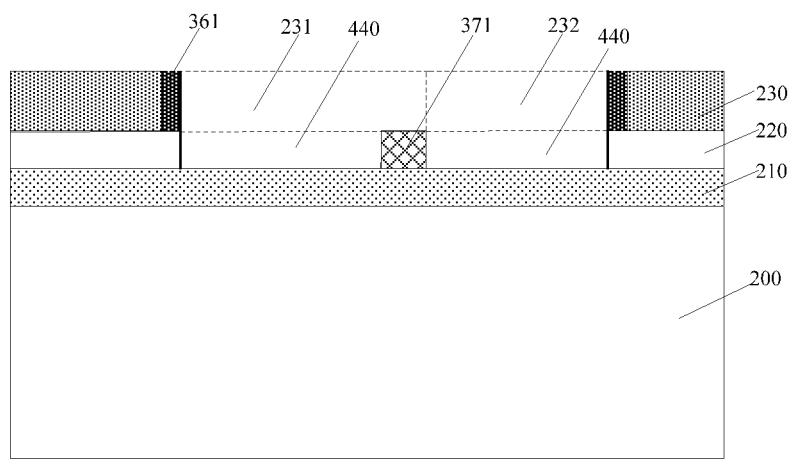

Returning to FIG. 49, after forming the second divided filling layer, a first middle trench and a second middle trench may be formed (S208). FIGS. 45-47 illustrate a corresponding semiconductor structure. FIG. 45 illustrates a schematic diagram formed on the basis of FIG. 43, FIG. 46 illustrates a schematic diagram formed on the basis of FIG. 44, FIG. 46 illustrates a cross-sectional view along a line 'M2-N2' in FIG. 45, and FIG. 47 illustrates a cross-sectional view along a line 'M1-N1' in FIG. 45.

Referring to FIGS. 45-47, by using the second divided filling layer 410 as a mask, the first mask layer 220 at the bottom of the second trench may be etched to form a second middle trench 420 in the first mask layer 220 over the second region A2. The second divided filling layer 410 may divide the second middle trench 420 in the second direction Y. After forming the second divided filling layer 410, by using the first divided filling layer 371 as a mask, the first mask layer 220 at the bottom the first trench may be etched to form a first middle trench 440 in the first mask layer 220 over the first region A1. The first divided filling layer 371 may divide the first middle trench 440 in the second direction Y. In one embodiment, the second middle trench 420 may be formed when forming the first middle trench 440, thereby simplifying the process.

In one embodiment, the method may also include etching the layer 200 to-be-etched at the bottom of the first middle trench 440 to form a first target trench in the layer 200 to-be-etched, and etching the layer 200 to-be-etched at the bottom of the second middle trench 420 to form a second target trench in the layer 200 to-be-etched. Further, the method may include forming a first conductive layer in the first target trench, and forming a second conductive layer in the second target trench.

Accordingly, the present disclosure also provides a semiconductor device formed by any one of the above-disclosed methods.

The present disclosure further provides a method for forming a semiconductor device. The method may include providing a layer to-be-etched. The layer to-be-etched may include a plurality of first regions and a plurality of second regions. The first regions and the second regions may be alternately arranged along a first direction. The first region may be in contact with an adjacent second region. The first region may include a first trench region, and the first trench region may include a first sub-trench region, a first separation region and a second sub-trench region. The first sub-trench region may be in contact with the first separation region in the second direction, and the first separation region may be in contact with the second sub-trench region in the second direction. The first separation region may be disposed between the first sub-trench region and the second sub-trench region. The second direction may be perpendicular to the first direction.

The method may also include forming a first separation trench disposed in the first separation region in the second mask layer over the first region, and forming a first photolithography mask layer over the second mask layer. The first photolithography mask layer may have a first photolithography opening over the first separation trench, and the first photolithography opening may be further extended to the second mask layer over the second sub-trench region in the second direction. The first photolithography mask layer may fully expose the first separation trench.

In addition, the method may include by using the first photolithography mask layer and the second mask layer as a mask, etching the first mask layer to form a first divided trench in the first mask layer over the first region. The first divided trench may be disposed at the bottom of the first separation trench. After forming the first divided trench, the method may include removing the first photolithography mask layer. After removing the first photolithography mask layer, the method may include removing the second mask layer over the second sub-trench region and the first sub-trench region by etching to form a first sub-trench and a second sub-trench in the second mask layer over the first region. The first sub-trench may be disposed over the first sub-trench region, and the second sub-trench may be disposed over the second sub-trench region. The first sub-trench and the second sub-trench may be connected to form a first trench.

After forming the first trench, the method may include forming a first divided filling layer in the first divided trench. Further, the method may include by using the first divided filling layer as a mask, etching the first mask layer at the bottom of the first trench to form a first middle trench in the first mask layer over the first region. The first divided filling layer may divide the first middle trench in the second direction.

The second region may include a second trench region, and the second trench region may include a third sub-trench region, a second separation region and a fourth sub-trench region. The second sub-trench region may be in contact with the second separation region in the second direction, and the second separation region may be in contact with the fourth sub-trench region in the second direction. The second separation region may be disposed between the third sub-trench region and the fourth sub-trench region. The second direction may be perpendicular to the first direction.

The method for forming the semiconductor device may further include before forming the first middle trench, forming a mask sidewall spacer on a sidewall of the first trench. The method may also include after forming the mask sidewall spacer and the first divided filling layer, forming a second separation trench disposed in the second separation region in the second mask layer over the second region. Moreover, the method may include forming a second photolithography mask layer over the second mask layer. The second photolithography mask layer may have a second photolithography opening over the second separation trench, and the second photolithography opening may be further extended to the second mask layer over the fourth sub-trench region in the second direction. The second photolithography mask layer may fully expose the second separation trench.

In addition, the method may include by using the second photolithography mask layer and the second mask layer as a mask, etching the first mask layer to form a second divided trench in the first mask layer over the second region. The second divided trench may be disposed at the bottom of the second separation trench. After forming the second divided trench, the method may include removing the second photolithography mask layer. After removing the second photolithography mask layer, the method may include removing the second mask layer over the fourth sub-trench region and the third sub-trench region by etching to form a fourth sub-trench and a third sub-trench in the second mask layer over the second region. The third sub-trench may be disposed over the third sub-trench region, and the fourth sub-trench may be disposed over the fourth sub-trench region. The third sub-trench and the fourth sub-trench may be connected to form a second trench. After forming the second trench, the method may include forming a second divided filling layer in the second divided trench.

Further, the method may include by using the second divided filling layer as a mask, etching the first mask layer at the bottom of the second trench to form a second middle trench in the first mask layer over the second region. The second divided filling layer may divide the second middle trench in the second direction. After forming the second divided filling layer, the method may include by using the first divided filling layer as a mask, etching the first mask layer at the bottom of the first trench to form a first middle trench in the first mask layer over the first region. The first divided filling layer may divide the first middle trench in the second direction.

Accordingly, the present disclosure also provides a semiconductor device formed by any one of the above-disclosed methods.

In the disclosed method for forming the semiconductor device, the first photolithography mask layer may have a first photolithography opening, and the first photolithography opening may have a same extension direction as the first sub-trench. The first photolithography opening may be disposed over the second portion of the first sub-trench, and may be further extended to the second mask layer over the second sub-trench region in the second direction. The overlapped region between the first photolithography opening and the first sub-trench may be used to define a position of the first divided filling layer.

The size of the first divided filling layer in the first direction may be limited by the width of the first sub-trench in the first direction. Therefore, the first divided filling layer may have a substantially small size in the first direction. Because the size of the first divided filling layer in the second direction desires to be limited by the size of the overlapped region between the first photolithography opening and the first sub-trench in the second direction, the first divided filling layer may have a substantially small size in the second direction. Therefore, the first divided filling layer may have a substantially small size in the first direction X and in the second direction Y, respectively, which may satisfy the requirements of the process design. The first photolithography opening may be disposed over the second portion of the first sub-trench, and may be further extended to the second mask layer over the second sub-trench region in the second direction. Therefore, the size of the first photolithography opening in the second direction may be made substantially large, which may reduce the challenges on the photolithography process, and reduce the process difficulty.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for forming a semiconductor device, comprising:
   providing a layer to-be-etched, wherein the layer to-be-etched includes a plurality of first regions arranged along a first direction, a first region includes a first trench region, the first trench region includes a first sub-trench region and a second sub-trench region, the first sub-trench region is in contact with an adjacent second sub-trench region in a second direction, and the second direction is perpendicular to the first direction;
   forming a first mask layer over the layer to-be-etched and a second mask layer over the first mask layer;
   forming a first sub-trench disposed over the first sub-trench region in the second mask layer over the first region;
   forming a first photolithography mask layer over the second mask layer and a first portion of the first sub-trench, wherein the first photolithography mask layer has a first photolithography opening disposed over a second portion of the first sub-trench, and the first photolithography opening is extended to the second mask layer over the second sub-trench region in the second direction;
   by using the first photolithography mask layer and the second mask layer as a mask, etching the first mask layer to form a first divided trench in the first mask layer over the first region, wherein the first divided trench is disposed at a bottom of an edge of the first sub-trench in the second direction;
   after forming the first divided trench, removing the first photolithography mask layer;
   after removing the first photolithography mask layer, removing the second mask layer over the second sub-trench region to form a second sub-trench disposed over the second sub-trench region in the second mask layer over the first region, wherein the second sub-trench is connected to the first sub-trench to form a first trench;
   after forming the first trench, forming a first divided filling layer in the first divided trench; and
   by using the first divided filling layer as a mask, etching the first mask layer at a bottom of the first trench to form a first middle trench in the first mask layer over the first region, wherein the first divided filling layer divides the first middle trench in the second direction.

2. The method according to claim 1, wherein:
   the first divided filling layer, the first mask layer, and the second mask layer are made of materials different from each other, wherein:
      the first divided filling layer is made of a material including silicon oxide, silicon nitride, titanium oxide, titanium nitride, aluminum nitride or aluminum oxide, the first mask layer is made of a material including silicon oxide, silicon nitride, or amorphous silicon, and the second mask layer is made of a material including silicon oxide, silicon nitride, or amorphous silicon.

3. The method according to claim 1, wherein:
the first photolithography opening has a width in the first direction larger than or equal to the first sub-trench.

4. The method according to claim 1, wherein:
the first photolithography opening has a width in the first direction smaller than the first sub-trench, and
the second sub-trench has a width in the first direction smaller than the first divided trench.

5. The method according to claim 1, wherein:
the first sub-trench has a width in the first direction in a range of approximately 10 nm-60 nm.

6. The method according to claim 1, wherein:
the first divided filling layer has a width in the first direction in a range of approximately 10 nm-60 nm.

7. The method according to claim 1, wherein:
for first photolithography openings disposed over adjacent first regions, an overlapped region between each first photolithography opening and first sub-trench has a same area; and
first divided filling layers disposed over adjacent first regions have a same size in the second direction.

8. The method according to claim 7, wherein:
the first divided filling layer has a width in the second direction in a range of approximately 10 nm-40 nm.

9. The method according to claim 1, wherein:
for first photolithography openings disposed over adjacent first regions, an overlapped region between each first photolithography opening and first sub-trench has a different area; and
first divided filling layers disposed over adjacent first regions have a different size in the second direction.

10. The method according to claim 1, after forming the first sub-trench and before forming
the first photolithography mask layer, further including:
forming a first planarization layer on the second mask layer, and in and over the first sub-trench;
forming a first bottom anti-reflective layer over the first planarization layer; and
forming the first photolithography mask layer over the first bottom anti-reflective layer.

11. The method according to claim 10, further including:
before forming the first divided trench, by using the first photolithography mask layer as a mask, removing the first bottom anti-reflective layer and the first planarization layer at a bottom of the first photolithography opening, and
after forming the first divided trench, removing the first bottom anti-reflective layer and the first planarization layer when removing the first photolithography mask layer.

12. The method according to claim 1, wherein:
the layer to-be-etched includes a plurality of second regions, wherein the first regions and the second regions are alternately arranged along the first direction, and the first region is in contact with an adjacent second region.

13. The method according to claim 12, further including:
after forming the second sub-trench or before forming the first sub-trench, forming a second divided trench in the second mask layer over the second region, wherein the second divided trench divides the second mask layer over the second region in the second direction;

after forming the second divided trench and the second sub-trench, forming a mask sidewall spacer on a sidewall of the first trench, wherein when forming the mask sidewall spacer, the first divided filling layer is formed in the first divided trench, and a second divided filling layer in formed in the second divided trench;

before forming the first middle trench, by using the second divided filling layer and the mask sidewall spacer as a mask, etching the second mask layer over the second region to form a second trench in the second mask layer over the second region, wherein the second divided filling layer divides the second trench in the second direction, and a sidewall of the second trench exposes the mask sidewall spacer;

after forming the second trench, by using the second mask layer, the mask sidewall spacer and the first divided filling layer as a mask, forming the first middle trench by etching the first mask layer at the bottom of the first trench; and by using the second mask layer, the mask sidewall spacer and the second divided filling layer as a mask, forming a second middle trench in the first mask layer over the second region by etching the first mask layer at a bottom of the second trench.

14. The method according to claim 13, wherein forming the mask sidewall spacer, the first
divided filling layer and the second divided filling layer includes:
forming a divided filling film on the sidewall and at the bottom of the first trench, in the first divided trench, in the second divided trench, and over the second mask layer; and
back-etching the divided filling film until a top surface of the second mask layer and the first mask layer at the bottom of the first trench are exposed, to form the first divided filling layer, the second divided filling layer, and the mask sidewall spacer.

15. The method according to claim 13, wherein:
the first divided filling layer has a size in the second direction less than or equal to twice a thickness of the mask sidewall spacer; and
the second divided filling layer has a size in the second direction less than or equal to twice the thickness of the mask sidewall spacer.

16. The method according to claim 1, wherein:
the layer to-be-etched includes a plurality of second regions, wherein the first regions and the second regions are alternately arranged along the first direction, and the first region is in contact with an adjacent second region; and
a second region includes a second trench region, wherein the second trench region includes a third sub-trench region and a fourth sub-trench region, the third sub-trench region is in contact with an adjacent fourth sub-trench region in the second direction, and the second trench region is in contact with an adjacent first trench region.

17. The method according to claim 16, further including:
before forming the first middle trench, forming a mask sidewall spacer on a sidewall of the first trench;
after forming the mask sidewall spacer and the first divided filling layer, forming a third sub-trench disposed over the third sub-trench region in the second mask layer over the second region;
forming a second photolithography mask layer over the second mask layer and a first portion of the third sub-trench, wherein the second photolithography mask layer has a second photolithography opening disposed over a second portion of the third sub-trench, and the second photolithography opening is extended to the second mask layer over the fourth sub-trench region in the second direction;

by using the second photolithography mask layer and the second mask layer as a mask, etching the first mask layer to form a second divided trench in the first mask layer over the second region, wherein the second divided trench is disposed at a bottom of an edge of the third sub-trench in the second direction;

after forming the second divided trench, removing the second photolithography mask layer;

after removing the second photolithography mask layer, removing the second mask layer over the fourth sub-trench region to form a fourth sub-trench disposed over the fourth sub-trench region in the second mask layer over the second region, wherein the fourth sub-trench and the third sub-trench are connected to form a second trench, and a sidewall of the second trench exposes the mask sidewall spacer;

after forming the second trench, forming a second divided filling layer in the second divided trench;

by using the second divided filling layer as a mask, etching the first mask layer at a bottom of the second trench to form a second middle trench in the first mask layer over the second region, wherein the second divided filling layer divides the second middle trench in the second direction; and after forming the second divided filling layer, forming the first middle trench.

18. The method according to claim 17, further including:

etching the layer to-be-etched at a bottom of the first middle trench to form a first target trench in the layer to-be-etched;

etching the layer to-be-etched at a bottom of the second middle trench to form a second target trench in the layer to-be-etched;

forming a first conductive layer in the first target trench; and forming a second conductive layer in the second target trench.

* * * * *